(12) United States Patent
Lee et al.

(10) Patent No.: US 12,349,348 B2
(45) Date of Patent: Jul. 1, 2025

(54) SEMICONDUCTOR DEVICE INCLUDING SUPPORT STRUCTURE, METHOD FOR MANUFACTURING THE SAME AND ELECTRONIC SYSTEM INCLUDING THE SAME

(71) Applicant: SAMSUNG ELECTRONICS CO., LTD., Suwon-si (KR)

(72) Inventors: Seugmin Lee, Seoul (KR); Kiyoon Kang, Seoul (KR); Kangmin Kim, Hwaseong-si (KR); Dongseong Kim, Seoul (KR); Junhyoung Kim, Seoul (KR); Byungkwan You, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 592 days.

(21) Appl. No.: 17/529,331

(22) Filed: Nov. 18, 2021

(65) Prior Publication Data

US 2022/0336489 A1    Oct. 20, 2022

(30) Foreign Application Priority Data

Apr. 19, 2021 (KR) .................. 10-2021-0050380

(51) Int. Cl.
*H10B 43/27* (2023.01)
*H01L 23/00* (2006.01)

(52) U.S. Cl.
CPC ........... *H10B 43/27* (2023.02); *H01L 23/562* (2013.01)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40-44; H10B 41/46-50;
(Continued)

(56) References Cited

U.S. PATENT DOCUMENTS 9,177,966 B1 * 11/2015 Rabkin .................. H10B 43/35
9,449,984 B2    9/2016 Alsmeier et al.
(Continued)

FOREIGN PATENT DOCUMENTS

KR    1020190023950 A    3/2019
KR    1020200039800 A    4/2020

*Primary Examiner* — Didarul A Mazumder
*Assistant Examiner* — Gustavo G Ramallo
(74) *Attorney, Agent, or Firm* — Muir Patent Law, PLLC

(57) ABSTRACT

A semiconductor device of the disclosure includes a peripheral circuit structure including a peripheral transistor, a semiconductor layer on the peripheral circuit structure, a source structure on the semiconductor layer, a gate stack structure disposed on the source structure and including insulating patterns and conductive patterns alternately stacked, a memory channel structure electrically connected to the source structure and penetrating the gate stack structure, a support structure penetrating the gate stack structure and the source structure, and an insulating layer covering the gate stack structure, the memory channel structure and the support structure. The support structure includes an outer support layer contacting side walls of the insulating patterns and side walls of the conductive patterns, and a support pattern and an inner support layer contacting an inner side wall of the outer support layer.

20 Claims, 31 Drawing Sheets

(58) Field of Classification Search
CPC ........ H10B 41/60; H10B 41/70; H10B 43/00;
H10B 43/10; H10B 43/20; H10B 43/23;
H10B 43/27; H10B 43/30; H10B 43/35;
H10B 43/40; H10B 43/50; H10B 51/00;
H10B 51/10; H10B 51/20; H10B 51/30;
H10B 51/40; H10B 51/50
See application file for complete search history.

(56) References Cited

U.S. PATENT DOCUMENTS

| | | |
|---|---|---|
| 9,484,353 B1 | 11/2016 | Lai et al. |
| 9,515,074 B2 | 12/2016 | Whang et al. |
| 10,290,649 B2 | 5/2019 | Matsuno |
| 10,381,366 B1 * | 8/2019 | Takahashi .............. H10B 63/20 |
| 10,608,013 B1 | 3/2020 | Xiao |
| 10,797,076 B2 | 10/2020 | Hua et al. |
| 10,854,621 B2 | 12/2020 | Hua et al. |
| 10,861,872 B2 | 12/2020 | Hua et al. |
| 2015/0311209 A1 * | 10/2015 | Whang .................. H10B 43/27 |
| | | 438/268 |
| 2016/0049423 A1 * | 2/2016 | Yoo ........................ H10B 43/40 |
| | | 257/329 |
| 2016/0141294 A1 * | 5/2016 | Peri .................. H01L 21/28512 |
| | | 438/653 |
| 2020/0105783 A1 | 4/2020 | Baek |
| 2020/0127006 A1 | 4/2020 | Otsu et al. |
| 2020/0152653 A1 | 5/2020 | Lu et al. |

* cited by examiner

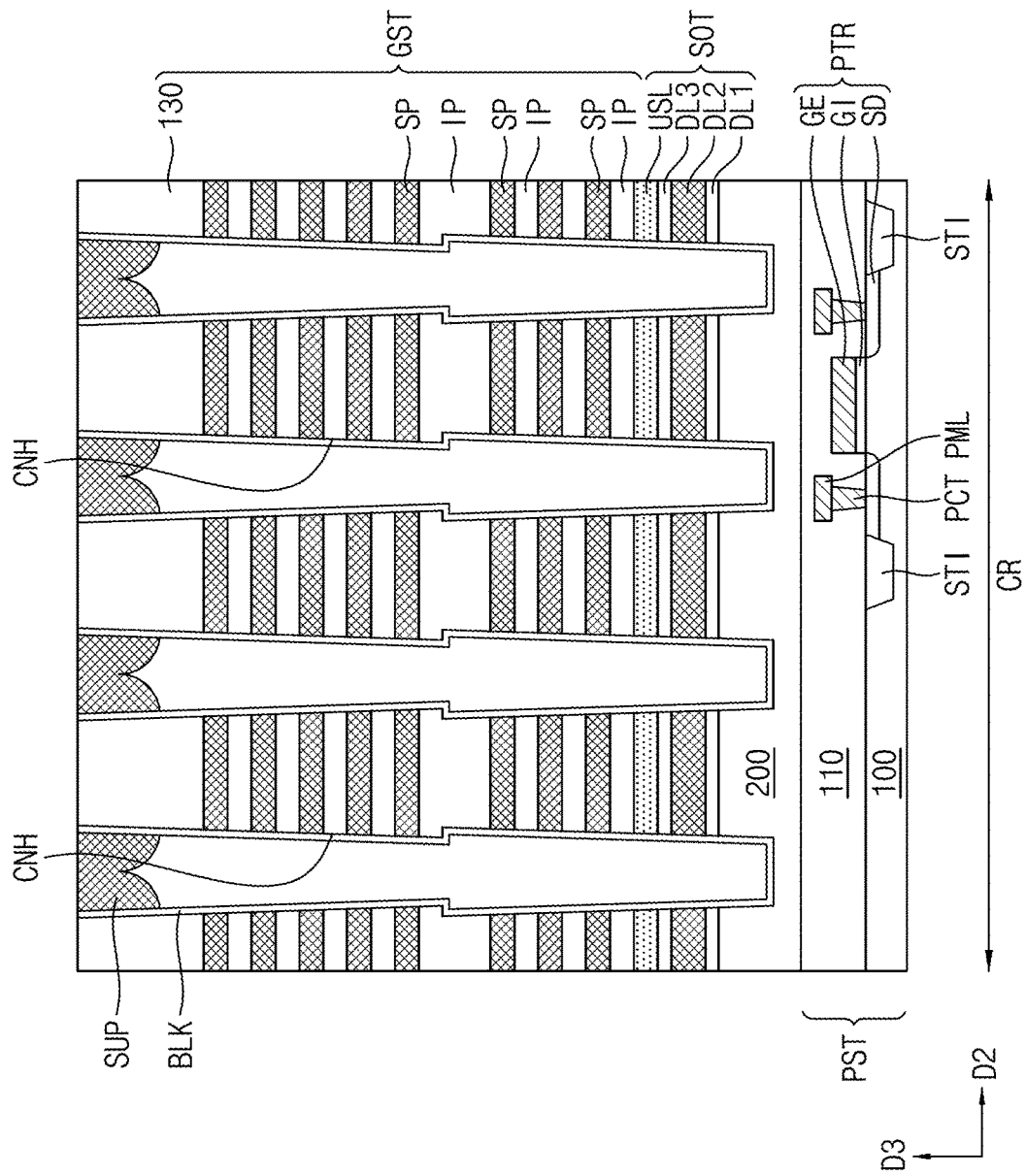

SEMICONDUCTOR DEVICE INCLUDING SUPPORT STRUCTURE, METHOD FOR MANUFACTURING THE SAME AND ELECTRONIC SYSTEM INCLUDING THE SAME

CROSS-REFERENCE TO THE RELATED APPLICATION

This application claims priority from Korean Patent Application No. 10-2021-0050380, filed on Apr. 19, 2021, in the Korean Intellectual Property Office, the disclosure of which is incorporated herein by reference in its entirety.

BACKGROUND

1. Field

Exemplary embodiments of the disclosure relate to a semiconductor device, a method for manufacturing the same, and an electronic system including the same. In particular, the exemplary embodiments of the disclosure relate to a semiconductor device having a support structure, a method for manufacturing the same, and an electronic system including the same.

2. Description of the Related Art

In an electronic system requiring storage of data, a semiconductor device capable of storing large volumes of data is needed. Accordingly, research on a scheme capable of increasing the data storage capacity of a semiconductor device is being conducted. For example, one method for increasing the data storage capacity of a semiconductor device includes implementing a semiconductor device including three-dimensionally arranged memory cells in place of two-dimensionally arranged memory cells.

SUMMARY

A semiconductor device according to exemplary embodiments of the disclosure may include a peripheral circuit structure including a peripheral transistor, a semiconductor layer on the peripheral circuit structure, a source structure on the semiconductor layer, a gate stack structure disposed on the source structure, the gate stack structure including insulating patterns and conductive patterns alternately stacked, a memory channel structure electrically connected to the source structure while extending through the gate stack structure, a support structure extending through the gate stack structure and the source structure, and an insulating layer covering the gate stack structure, the memory channel structure and the support structure. The support structure may include an outer support layer contacting side walls of the insulating patterns and side walls of the conductive patterns, and a support pattern and an inner support layer contacting an inner side wall of the outer support layer. A top surface of the outer support layer, a top surface of the inner support layer, and a top surface of the support pattern may contact a bottom surface of the insulating layer.

A semiconductor device according to exemplary embodiments of the disclosure may include a gate stack structure including an insulating pattern and a conductive pattern alternately stacked, a memory channel structure extending through the gate stack structure in a cell region, and a support structure extending through the gate stack structure in an extension region. The support structure may include an outer support layer contacting a side wall of the insulating pattern and a side wall of the conductive pattern, and an inner support layer and a support pattern contacting an inner side wall of the outer support layer. An upper portion of the inner support layer may be surrounded by the support pattern.

An electronic system according to exemplary embodiments of the disclosure may include a main substrate, a semiconductor device on the main substrate, and a controller electrically connected to the semiconductor device on the main substrate. The semiconductor device may include a gate stack structure including an insulating pattern and a conductive pattern alternately stacked, a memory channel structure extending through the gate stack structure in a cell region of the semiconductor device, and a support structure extending through the gate stack structure in an extension region of the semiconductor device. The support structure may include an outer support layer contacting a side wall of the insulating pattern and a side wall of the conductive pattern, and a support pattern contacting an inner side wall of the outer support layer. A cavity may be defined by the inner side wall of the outer support layer and a bottom surface of the support pattern. An upper portion of the cavity may be surrounded by the support pattern.

A method for manufacturing a semiconductor device in accordance with exemplary embodiments of the disclosure may include forming a gate stack structure, forming a channel hole and a support hole extending through the gate stack structure, forming a preliminary outer layer covering the gate stack structure, forming a preliminary support pattern layer on the preliminary outer layer, thereby closing the channel hole and the support hole, removing an upper portion of the preliminary support pattern layer, thereby separating the preliminary support pattern layer into a first support pattern in the channel hole and a second support pattern in the support hole, and removing the first support pattern.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
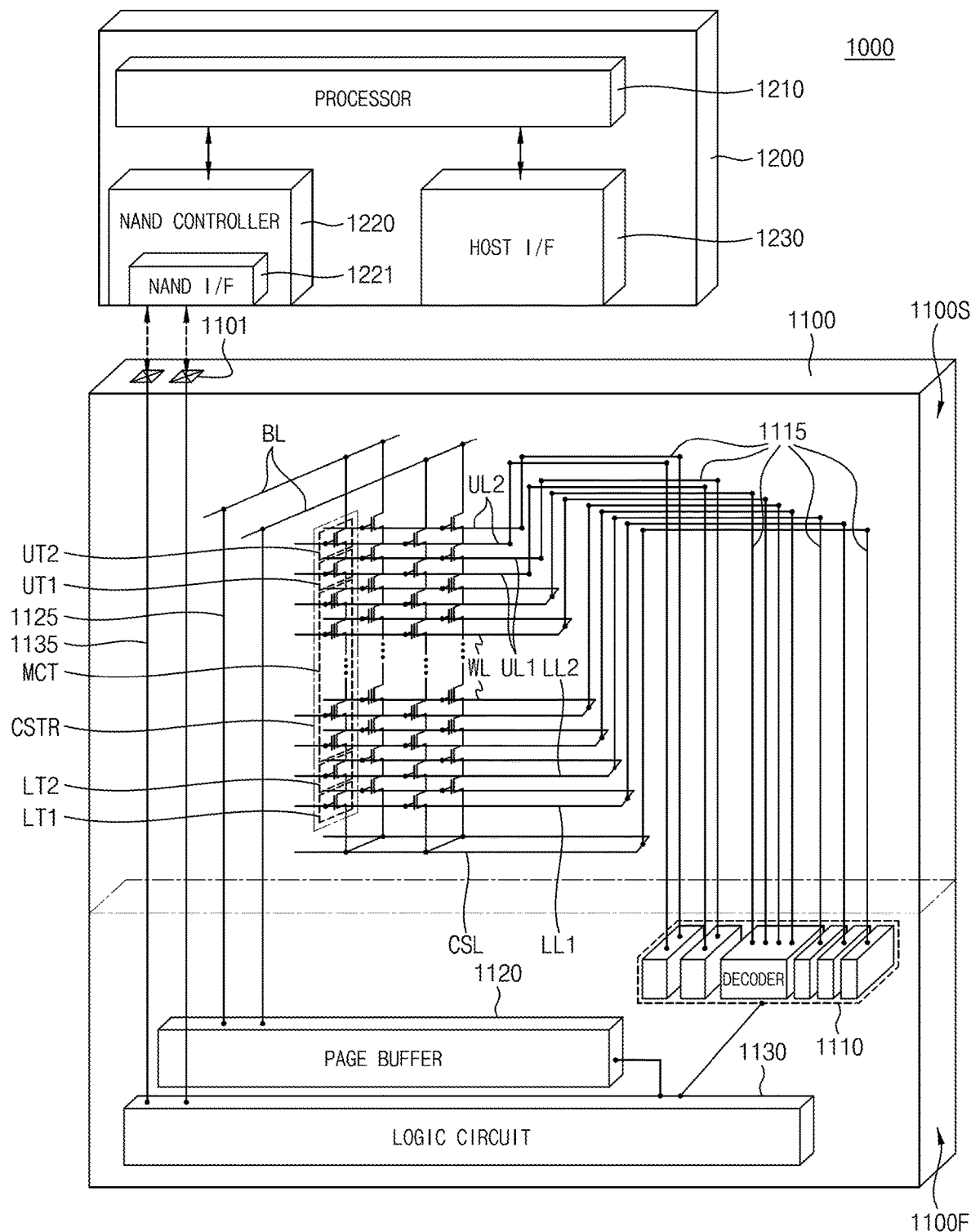
FIG. 1 is a schematic view of an electronic system including a semiconductor device according to an exemplary embodiment.

FIG. 1 is a view schematically showing an electronic system including a semiconductor device according to an exemplary embodiment of the disclosure.

Referring to FIG. 1, an electronic system 1000 according to an exemplary embodiment of the disclosure may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. For example, the electronic system 1000 may be a solid-state drive (SSD) device, a universal serial bus (USB) thumb drive, a computing system, a medical device or a communication device which includes one semiconductor device 1100 or a plurality of semiconductor devices 1100.

The semiconductor device 1100 may be a non-volatile memory device. For example, the semiconductor device 1100 may be a NAND flash memory device which will be described later with reference to FIGS. 5A to 5E. The semiconductor device 1100 may include a first structure 1110F, and a second structure 1100S on the first structure 1110F. In exemplary embodiments, the first structure 1110F may be disposed at one side of the second structure 1100S. The first structure 1110F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be diversely varied in accordance with embodiments.

In exemplary embodiments, the upper transistors UT1 and UT2 may include a string selection transistor, whereas the lower transistors LT1 and LT2 may include a ground selection transistor. The first and second gate lower lines LL1 and LL2 may be gate electrodes of the lower transistors LT1 and LT2, respectively. The word lines WL may be gate electrodes of the memory cell transistors MCT, respectively. The first and second gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 via first connecting lines 1115 extending from an inside of the first structure 1110F to the second structure 1100S. The bit lines BL may be electrically connected to the page buffer 1120 via second connecting lines 1125 extending from the inside of the first structure 1110F to the second structure 1100S.

In the first structure 1110F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 via an input/output connecting line 1135 extending from the inside of the first structure 1110F to the second structure 1100S.

The controller 1200 may include a processor 1210, a NAND controller 1220, and a host interface (I/F) 1230. In accordance with exemplary embodiments, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface (I/F) 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc. may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Figure 2:
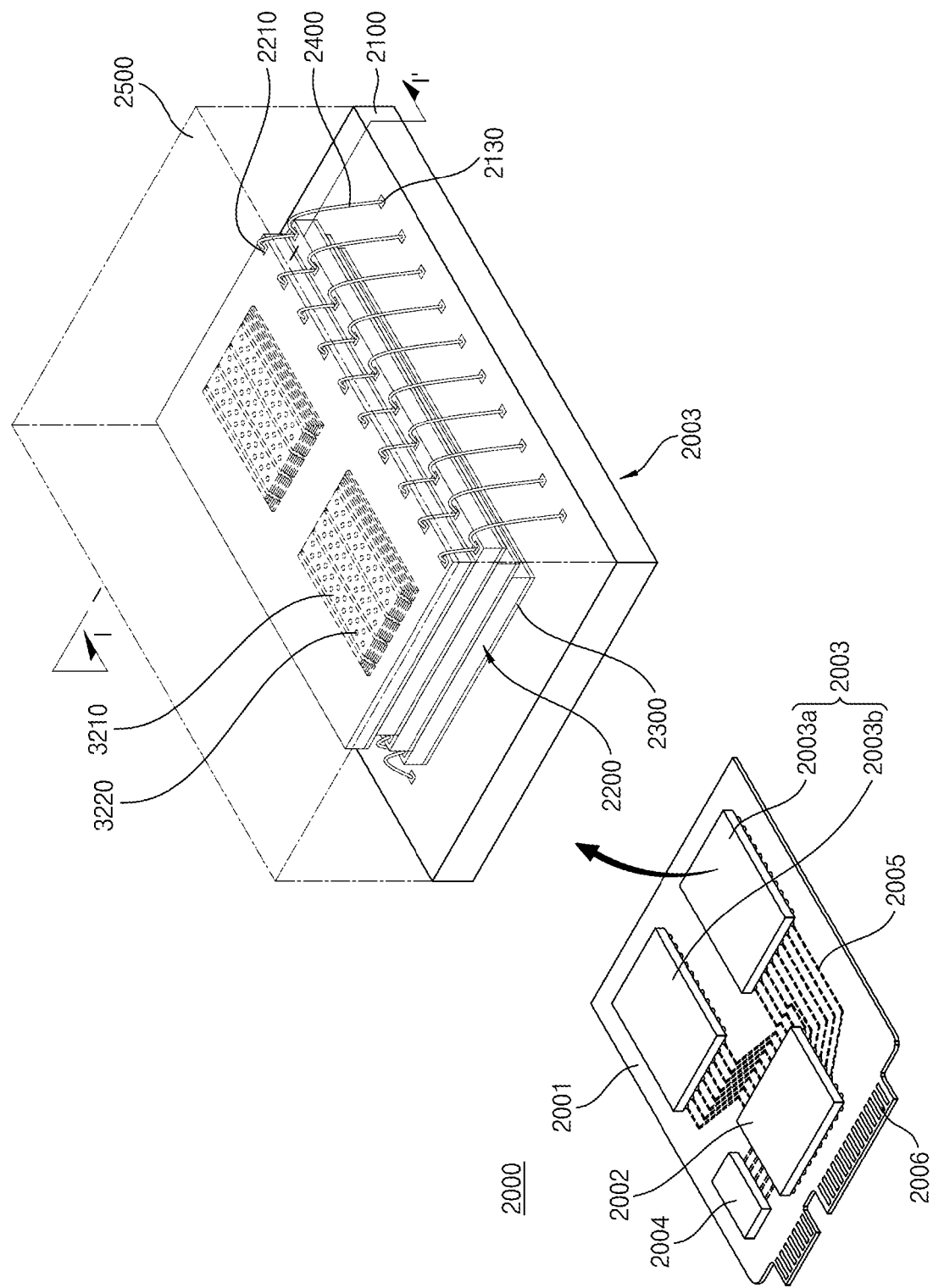
FIG. 2 is a perspective view of an electronic system including a semiconductor device according to an exemplary embodiment.

FIG. 2 is a perspective view schematically showing an electronic system including a semiconductor device according to an exemplary embodiment of the disclosure.

Referring to FIG. 2, an electronic system 2000 according to an exemplary embodiment of the disclosure may include a main substrate 2001, a controller 2002 mounted on the main substrate 2001, at least one semiconductor package 2003, and a dynamic random-access memory (DRAM) 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may be varied in accordance with a communication interface between the electronic system 2000 and the external host. In exemplary embodiments, the electronic system 2000 may communicate with the external host in accordance with any one of interfaces, e.g., universal serial bus (USB), peripheral component interconnect express (PCI-Express), serial advanced technology attachment (SATA), M-PHY for universal flash storage (UFS), etc. In exemplary embodiments, the electronic system 2000 may operate by power supplied from the external host via the connector 2006. The electronic system 2000 may further include a power management integrated circuit (PMIC) for distributing power supplied from the external host to the controller 2002 and the semiconductor package 2003.

The controller 2002 may write data in the semiconductor package 2003 or may read out data from the semiconductor package 2003. The controller 2002 may also enhance an operation speed of the electronic system 2000.

The DRAM 2004 may be a buffer memory for reducing a speed difference between the semiconductor package 2003, which is a data storage space, and the external host. The DRAM 2004, which is included in the electronic system 2000, may also operate as a kind of cache memory. The DRAM 2004 may provide a space for temporarily storing data in a control operation for the semiconductor package 2003. When the DRAM 2004 is included in the electronic system 2000, the controller 2002 may further include a DRAM controller for controlling the DRAM 2004, in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, bonding layers 2300 respectively disposed at bottom surfaces of the semiconductor chips 2200, a connecting structure 2400 for electrically connecting the semiconductor chips 2200 and the package substrate 2100, and a molding layer 2500 covering the semiconductor chips 2200 and the connecting structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stack structures 3210 and memory channel structures 3220. Each of the semiconductor chips 2200 may include a semiconductor device which will be described later with reference to FIGS. 5A to 5E.

In exemplary embodiments, the connecting structure 2400 may be a bonding wire for electrically connecting the input/output pad 2210 and the package upper pads 2130. Accordingly, in each of the first and second semiconductor packages 2003a and 2003b, the semiconductor chips 2200 may be electrically interconnected through wire bonding, and may be electrically connected to the corresponding package upper pads 2130 of the package substrate 2100. In accordance with embodiments, in each of the first and second semiconductor packages 2003a and 2003b, the semiconductor chips 2200 may be electrically interconnected by a connecting structure including a through-silicon via (TSV) in place of the bonding wire type connecting structure 2400.

In exemplary embodiments, the controller 2002 and the semiconductor chips 2200 may be included in one package. In an exemplary embodiment, the controller 2002 and the semiconductor chips 2200 may be mounted on a separate interposer substrate different from the main substrate 2001. In this case, the controller 2002 and the semiconductor chips 2200 may be interconnected by wirings formed at the interposer substrate.

Figure 3:
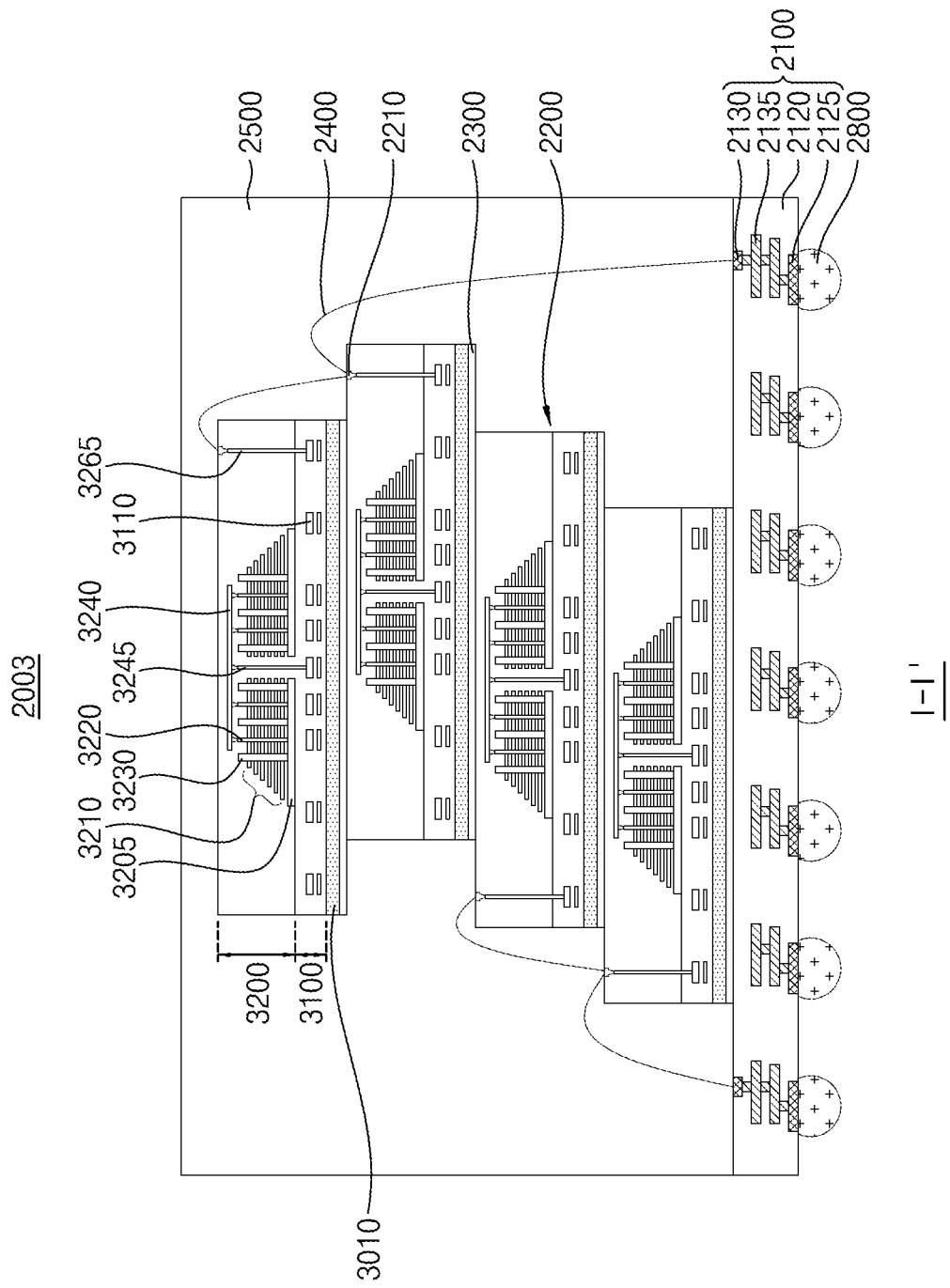
FIGS. 3 and 4 are schematic sectional views of semiconductor packages according to exemplary embodiments.
Figure 4:
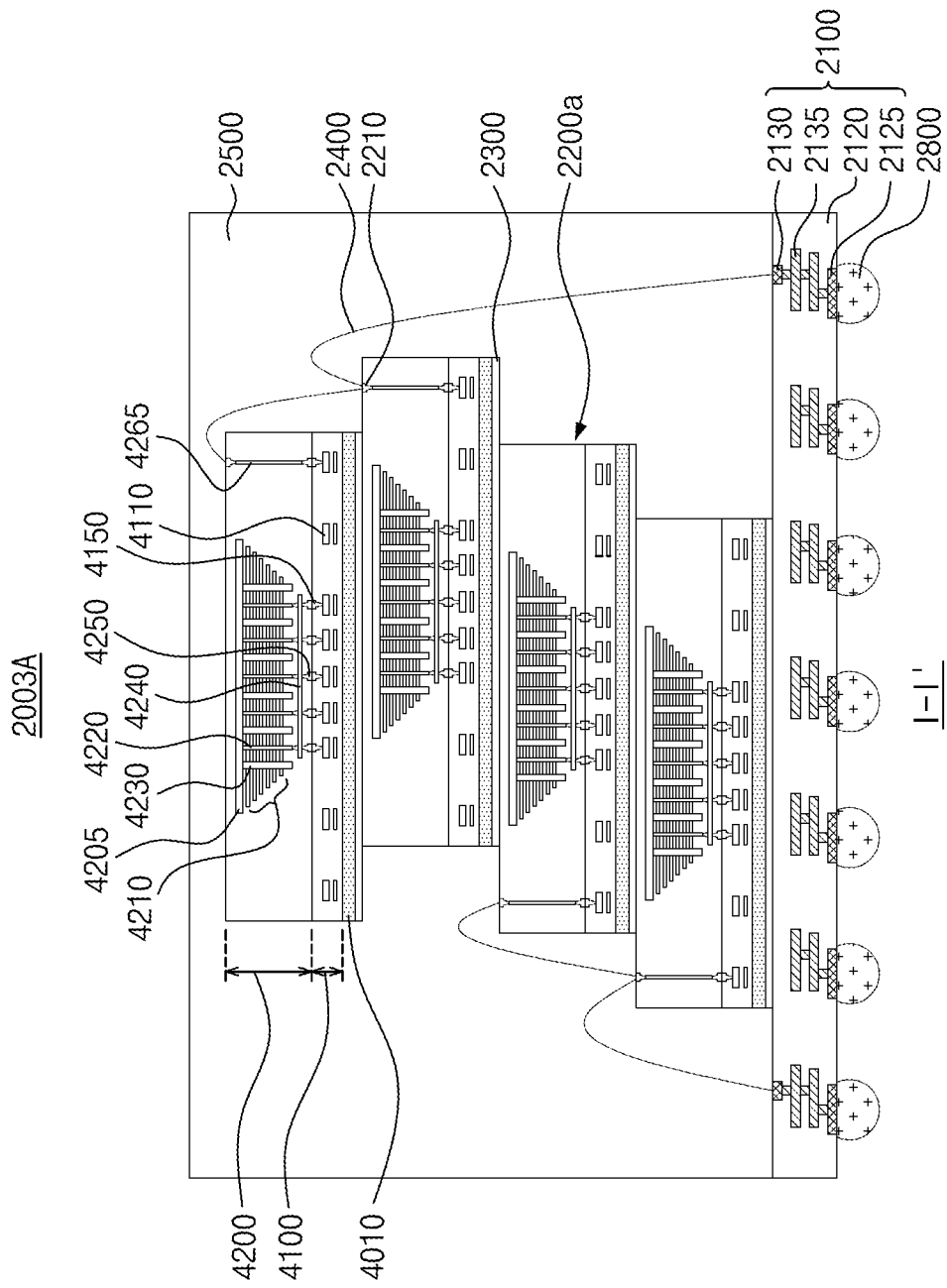

FIGS. 3 and 4 are sectional views schematically showing semiconductor packages according to exemplary embodiments of the disclosure. Each of FIGS. 3 and 4 explains an exemplary embodiment of the semiconductor package 2003 of FIG. 2, and conceptually shows an area of the semiconductor package 2003 along line I-I' in FIG. 2.

Referring to FIG. 3, in the semiconductor package 2003, the package substrate 2100 thereof may be a printed circuit board. The package substrate 2100 may include a package substrate body 2120, package upper pads 2130 disposed at a top surface of the package substrate body 2120, lower pads 2125 disposed at a bottom surface of the package substrate body 2120 or exposed through the bottom surface of the package substrate body 2120, and inner wirings 2135 electrically connecting the package upper pads 2130 and the lower pads 2125 within the package substrate body 2120. The package upper pads 2130 may be electrically connected to connecting structures 2400. The lower pads 2125 may be connected to the wiring patterns 2005 of the main substrate 2010 of the electronic system 2000 through conductive connectors 2800, as shown in FIG. 2.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wirings 3110. The second structure 3200 may include a common source line 3205, the gate stack structure 3210 on the common source line 3205, the memory channel structures 3220 and separation structures 3230 extending through the gate stack structure 3210, bit lines 3240 electrically connected to the memory channel structures 3220, and gate connecting wirings electrically connected to word lines ("WL" in FIG. 1) of the gate stack structure 3210.

Each of the semiconductor chips 2200 may include a through wiring 3245 electrically connected to the peripheral wirings 3110 of the first structure 3100 while extending into the second structure 3200. The through wiring 3245 may extend through the gate stack structure 3210, and may be further disposed outside the gate stack structure 3210. Each of the semiconductor chips 2200 may further include an input/output connecting wiring 3265 electrically connected to the peripheral wirings 3110 of the first structure 3100 while extending into the second structure 3200, and an input/output pad 2210 electrically connected to the input/output connecting wiring 3265.

Referring to FIG. 4, in a semiconductor package 2003A, each of semiconductor chips 2200a thereof may include a semiconductor substrate 4010, a first structure 4100 on the semiconductor substrate 4010, and a second structure 4200 bonded to the first structure 4100 in a wafer bonding manner on the first structure 4100.

The first structure 4100 may include a peripheral circuit region including a peripheral wiring 4110 and first bonding structures 4150. The second structure 4200 may include a common source line 4205, a gate stack structure 4210 between the common source line 4205 and the first structure 4100, memory channel structures 4220 and a separation structure 4230 extending through the gate stack structure 4210, and second bonding structures 4250 electrically connected to the memory channel structures 4220 and word lines of the gate stack structure 4210 ("WL" in FIG. 1), respectively. For example, the second bonding structures 4250 may be electrically connected to the memory channel structures 4220 and the word lines ("WL" in FIG. 1) through bit lines 4240 electrically connected to the memory channel structures 4220 and gate connecting wirings electrically connected to the word lines ("WL" in FIG. 1), respectively. The first bonding structures 4150 of the first structure 4100 and the second bonding structures 4250 of the second structure 4200 may be bonded to each other while contacting each other. Bonding portions of the first bonding structures 4150 and the second bonding structures 4250 may be made of, e.g., copper (Cu).

Each of the semiconductor chips 2200a may further include an input/output pad 2210, and an input/output connecting wiring 4265 under the input/output pad 2210. The input/output connecting wiring 4265 may be electrically connected to a part of the first bonding structures 4150.

The semiconductor chips 2200 of FIG. 3 and the semiconductor chips 2200a of FIG. 4 may be electrically interconnected by bonding wire type connecting structures 2400. For example, semiconductor chips in one semiconductor package such as the semiconductor chips 2200 of FIG. 3 and the semiconductor chips 2200a of FIG. 4 may be electrically interconnected by a connecting structure including a TSV.

Figure 5A:
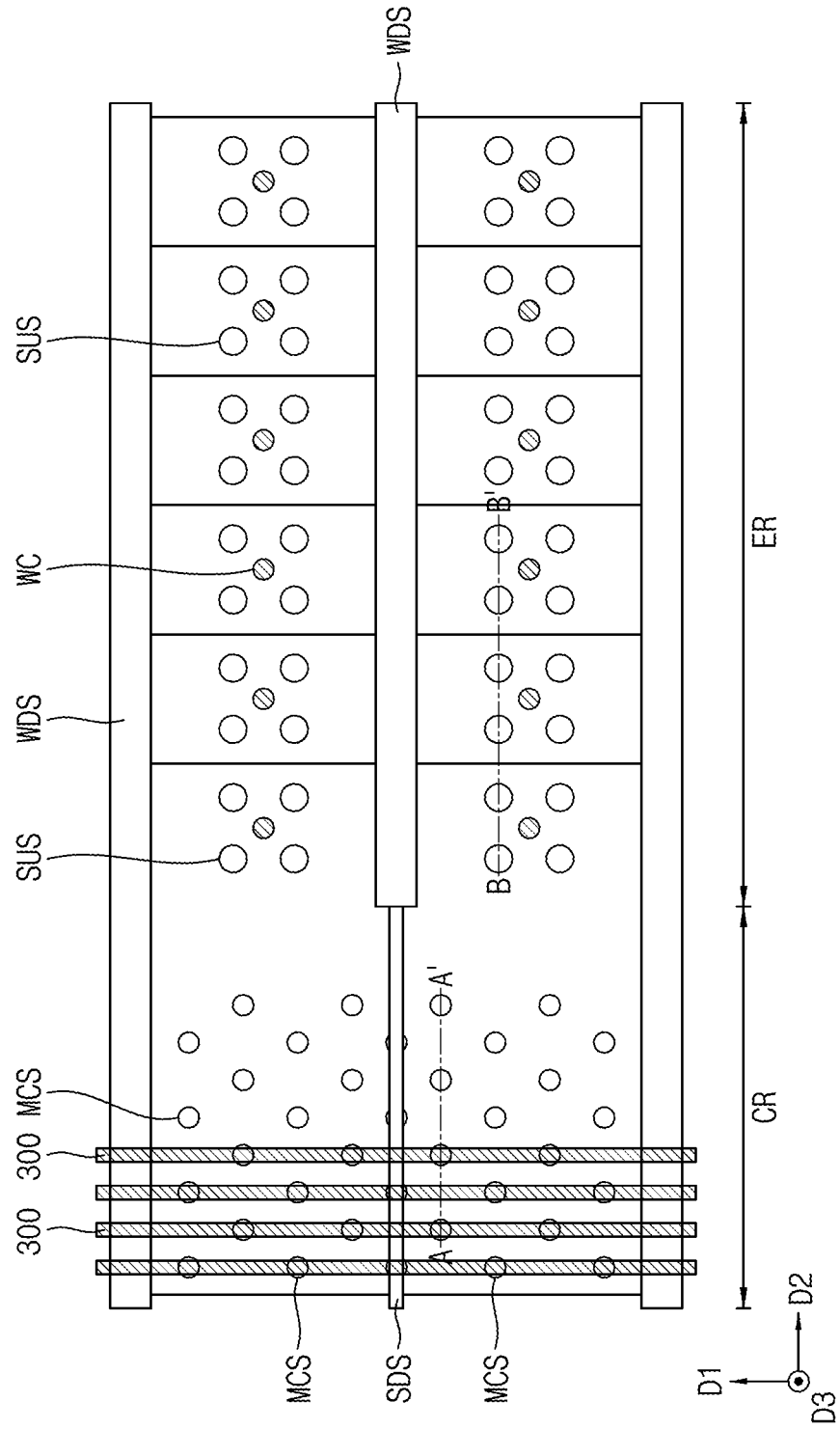
FIG. 5A is a plan view of a semiconductor device according to an exemplary embodiment.
Figure 5B:
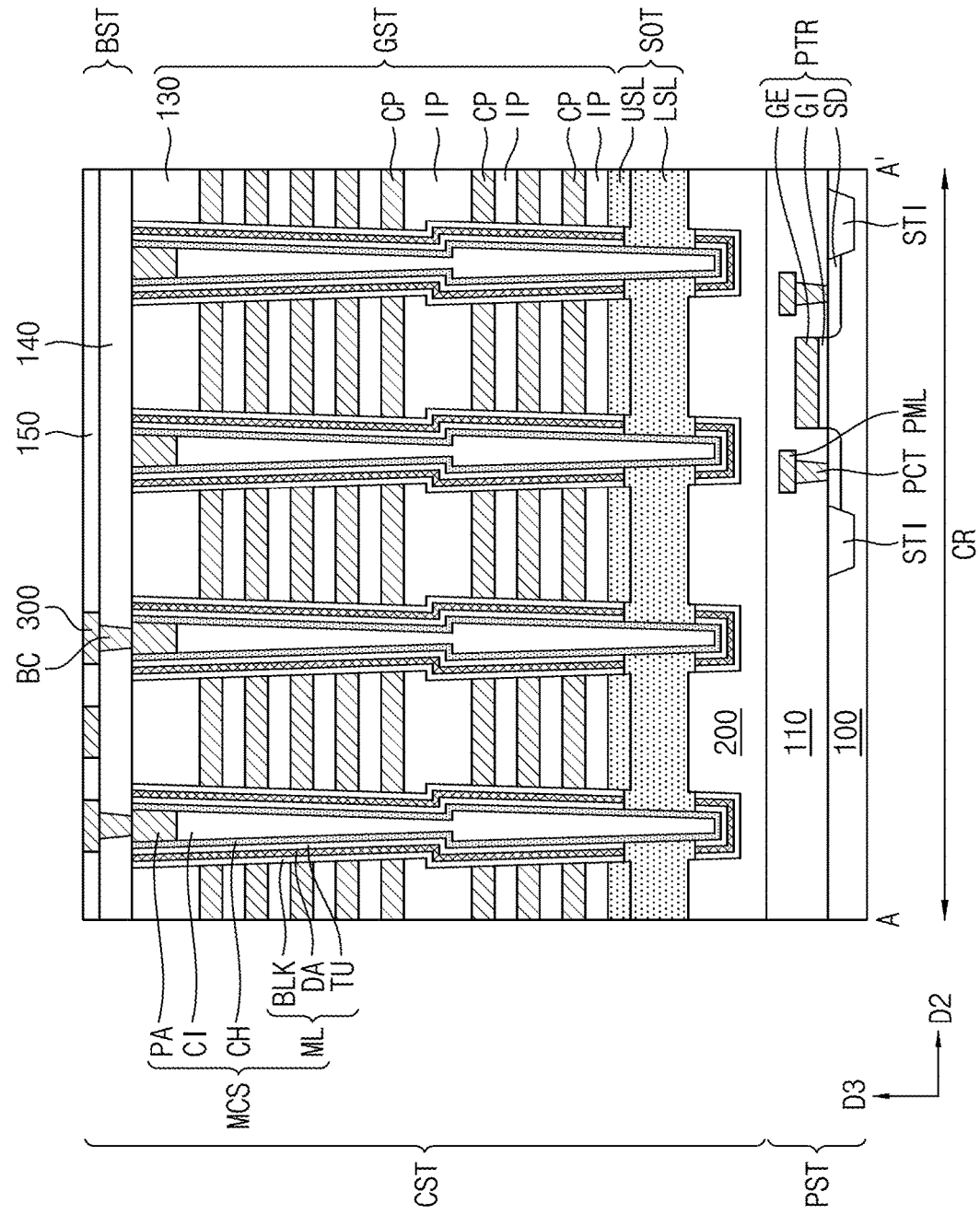
FIGS. 5B and 5C are cross-sectional views along lines A-A' and B-B' in FIG. 5A, respectively.
Figure 5C:
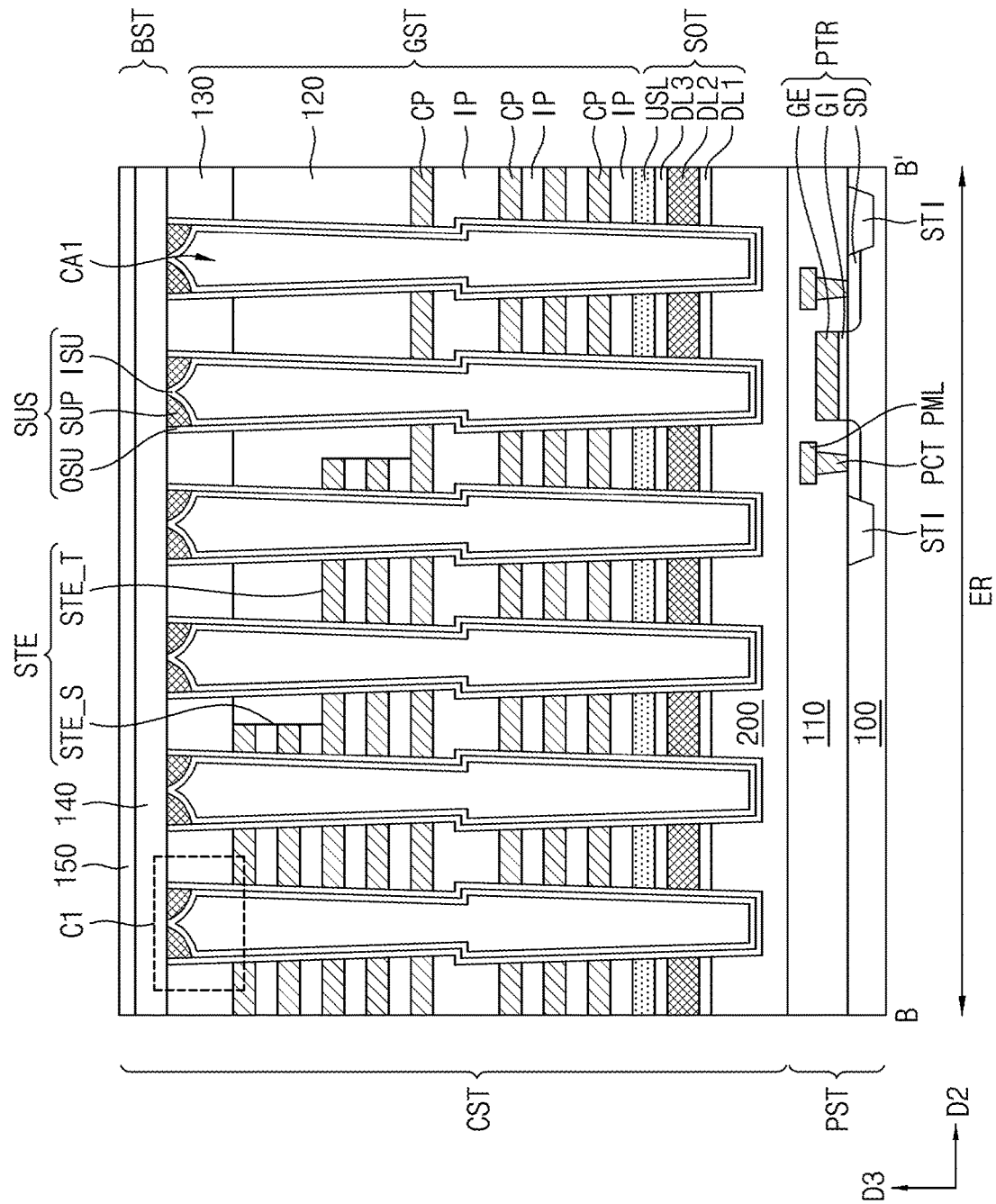
Figure 5D:
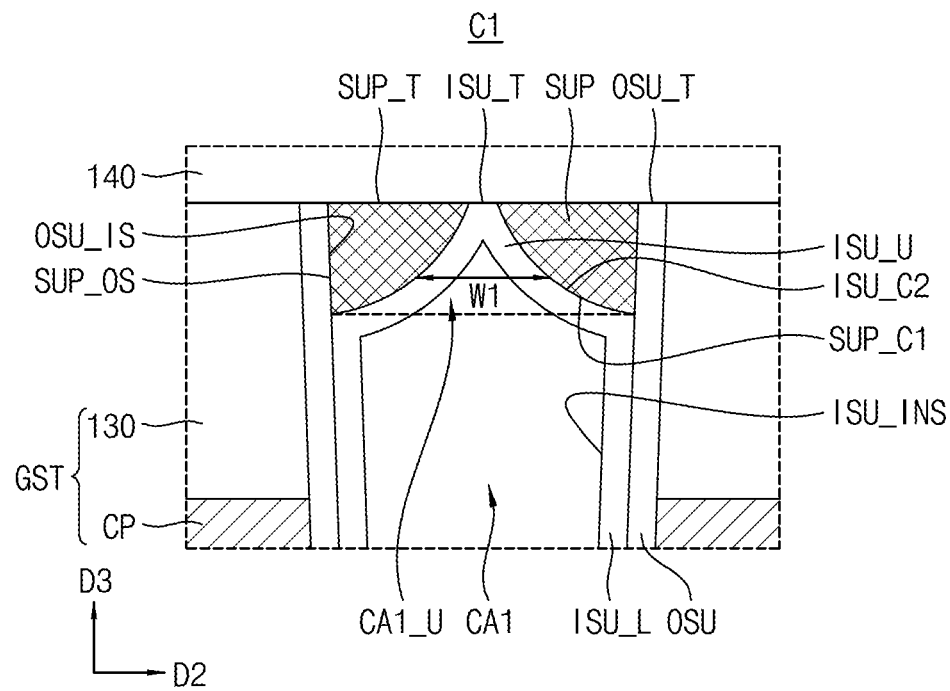
FIG. 5D is an enlarged view of portion C1 of FIG. 5C.
Figure 5E:
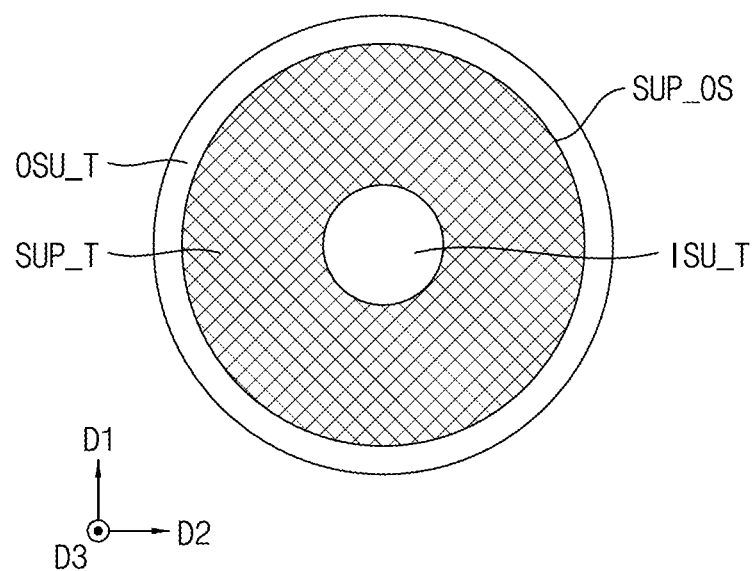
FIG. 5E is a top view of a support structure in the semiconductor device of FIG. 5A.

FIG. 5A is a plan view of a semiconductor device according to an exemplary embodiment of the disclosure. FIG. 5B is a cross-sectional view taken along line A-A' in FIG. 5A. FIG. 5C is a cross-sectional view taken along line B-B' in FIG. 5A. FIG. 5D is an enlarged view of portion C1 of FIG. 5C. FIG. 5E is a top view of a support structure in the semiconductor device of FIG. 5A.

Referring to FIGS. 5A to 5C, a semiconductor device according to an exemplary embodiment of the disclosure may include a peripheral circuit structure PST and a memory cell structure CST. The memory cell structure CST may be provided on the peripheral circuit structure PST.

The semiconductor device may include a cell region CR and an extension region ER. The cell region CR and the extension region ER may be regions divided in a plane defined by a first direction D1 and/or a second direction D2. The first direction D1 and the second direction D2 may intersect each other. For example, the first direction D1 and the second direction D2 may perpendicularly intersect each other. For example, as illustrated in FIG. 5A, the cell region CR and the extension region ER may be adjacent to each other in the second direction D2.

The peripheral circuit structure PST may include a substrate 100. The substrate 100 may have the form of a plate extending along a plane defined by the first direction D1 and the second direction D2. In exemplary embodiments, the substrate 100 may be a semiconductor substrate. For example, the substrate 100 may be a silicon substrate. In exemplary embodiments, the substrate 100 may be a silicon-on-insulator (SOI) substrate.

The peripheral circuit structure PST may further include a first insulating layer 110 covering the substrate 100. The first insulating layer 110 may cover a top surface of the substrate 100. The first insulating layer 110 may include an insulating material. For example, the first insulating layer 110 may include an oxide. In exemplary embodiments, the first insulating layer 110 may be a multilayer insulating layer.

The peripheral circuit structure PST may further include peripheral transistors PTR. The peripheral transistor PTR may be provided between the substrate 100 and the first insulating layer 110. The peripheral transistor PTR may include source/drain regions SD, a gate electrode GE, and a gate insulating layer GI. The gate electrode GE and the gate insulating layer GI may be provided between the source/drain regions SD. The gate electrode GE may be spaced apart from the substrate 100 by the gate insulating layer GI. The source/drain regions SD may be formed by doping the substrate 100 with impurities. The gate electrode GE may include a conductive material. The gate insulating layer GI may include an insulating material.

The peripheral circuit structure PST may further include element isolation layers STI. The element isolation layers STI may be provided in the substrate 100. The element isolation layer STI may be disposed among the peripheral transistors PTR and, as such, may electrically isolate the peripheral transistors PTR from one another. The element isolation layer STI may include an insulating material.

The peripheral circuit structure PST may further include peripheral contacts PCT and peripheral wirings PML. The peripheral contact PCT may be connected to the peripheral transistor PTR, and the peripheral wiring PML may be connected to the peripheral contact PCT. The peripheral contact PCT and the peripheral wiring PML may be provided in the first insulating layer 110. The peripheral contact PCT and the peripheral wiring PML may include a conductive material.

The memory cell structure CST may include a semiconductor layer 200, a source structure SOT, a gate stack structure GST, memory channel structures MCS, support structures SUS, and a bit line structure BST.

The semiconductor layer 200 may be disposed on the first insulating layer 110 of the peripheral circuit structure PST. The semiconductor layer 200 may include an extrinsic semiconductor material doped with impurities and/or an intrinsic semiconductor material not doped with impurities. For example, the semiconductor layer 200 may include at least one of silicon (Si), germanium (Ge), silicon germanium (SiGe), gallium arsenide (GaAs), indium gallium arsenide (InGaAs), aluminum gallium arsenide (AlGaAs), or a combination thereof.

The source structure SOT may be provided on the semiconductor layer 200.

The source structure SOT may include a lower source layer LSL, an upper source layer USL, a first dummy layer DL1, a second dummy layer DL2, and a third dummy layer DL3.

The lower source layer LSL may be provided on the semiconductor layer 200. The lower source layer LSL may be disposed in the cell region CR. The lower source layer LSL may include a conductive material. For example, the lower source layer LSL may include polysilicon doped with impurities.

The first dummy layer DL1, the second dummy layer DL2, and the third dummy layer DL3 may be sequentially provided on the semiconductor layer 200 in a third direction D3, e.g., the first through third dummy layers DL1 through DL3 may be stacked on top of each other in the third direction D3. The third direction D3 may intersect the first direction D1 and the second direction D2. For example, the third direction D3 may perpendicularly intersect the first direction D1 and the second direction D2.

The first to third dummy layers DL1, DL2 and DL3 may be disposed, e.g., only, in the extension region ER, e.g., among the extension region ER and the cell region CR. The first to third dummy layers DL1, DL2 and DL3 may be disposed at the same level as the lower source layer LSL, e.g., a combined thickness of the first through third dummy layers DL1 through DL3 in the third direction D3 may equal a thickness of the lower source layer LSL and may be colinear (e.g., coextensive) with the lower source layer LSL in the second direction D2. The first to third dummy layers DL1, DL2 and DL3 may include an insulating material. In exemplary embodiments, the first and third dummy layers DL1 and DL3 may include the same insulating material, and the second dummy layer DL2 may include an insulating material different from that of the first and third dummy layers DL1 and DL3. For example, the second dummy layer DL2 may include silicon nitride, and the first and third dummy layers DL1 and DL3 may include silicon oxide.

The upper source layer USL may cover the lower source layer LSL and the first to third dummy layers DL1, DL2 and DL3. The upper source layer USL may extend from the cell region CR to the extension region ER. The upper source layer USL may include a semiconductor material. For example, the upper source layer USL may include polysilicon doped with impurities or polysilicon not doped with impurities.

The gate stack structure GST may be provided on the source structure SOT. The gate stack structure GST may include insulating patterns IP and conductive patterns CP alternately stacked in the third direction D3. The insulating patterns IP may include an insulating material. For example, the insulating patterns IP may include an oxide. The conductive patterns CP may include a conductive material.

The gate stack structure GST may include a staircase structure STE. The staircase structure STE may be disposed in the extension region ER. The insulating patterns IP and the conductive patterns CP are configured in the form of steps and, as such, the staircase structure STE may be defined. A surface of the staircase structure STE may include step side walls STE_S and step top surfaces STE_T. The step side wall STE_S may be defined by a side wall of the insulating pattern IP and a side wall of the conductive pattern CP which are coplanar, e.g., aligned, with each other. A portion not covered by the insulating pattern IP from among overall portions of a top surface of the conductive pattern CP may be defined as the step top surface STE_T. The step side wall STE_S and the step top surface STE_T may be connected to each other. The step side walls STE_S may have levels gradually lowered as the step side walls STE_S are disposed at positions farther from the cell region CR, respectively. The step top surfaces STE_T may have levels gradually lowered as the step top surfaces STE_T are disposed at positions farther from the cell region CR, respectively.

The gate stack structure GST may further include a second insulating layer 120 and a third insulating layer 130. The second insulating layer 120 may cover the staircase structure STE. The second insulating layer 120 may cover the step side walls STE_S and the step top surfaces STE_T of the staircase structure STE. The third insulating layer 130 may cover a top surface of the uppermost conductive pattern CP and a top surface of the second insulating layer 120. The second and third insulating layers 120 and 130 may include an insulating material. For example, the second and third insulating layers 120 and 130 may include an oxide.

The memory channel structures MCS may be disposed, e.g., only, in the cell region CR, e.g., among the cell region CR and the extension region ER. The memory cell structures MCS may extend in the third direction D3 and, as such, may extend through the conductive patterns CP and the insulating patterns IP of the gate stack structure GST and the upper source layer USL and the lower source layer LSL of the source structure SOT. The memory cell structures MCS may penetrate the gate stack structure GST. The memory channel structures MCS may be surrounded by the insulating patterns IP and the conductive patterns CP of the gate stack structure GST. A lowermost portion of the memory channel structure MCS may be disposed in the semiconductor layer 200.

Each of the memory channel structures MCS may include a core insulating layer CI, a pad PA, a channel layer CH, and a memory layer ML. The core insulating layer CI may extend in the third direction D3 and, as such, may extend through the conductive patterns CP and the insulating patterns IP of the gate stack structure GST and through the upper source layer USL and the lower source layer LSL of the source structure SOT. The core insulating layer CI may include an insulating material. For example, the core insulating layer CI may include an oxide.

The pad PA may be provided on the core insulating layer CI. The pad PA may include a conductive material.

The channel layer CH may surround the core insulating layer CI and the pad PA. The channel layer CH may extend in the third direction D3 and, as such, may extend through the conductive patterns CP and the insulating patterns IP of the gate stack structure GST and through the upper source layer USL and the lower source layer LSL of the source structure SOT. The channel layer CH may cover a side wall and a bottom surface of the core insulating layer CI. The channel layer CH may contact the lower source layer LSL of the source structure SOT. The memory channel structure MCS may be electrically connected to the source structure SOT. The channel layer CH of the memory channel structure MCS may be electrically connected to the lower source layer LSL of the source structure SOT. The channel layer CH may include a semiconductor material. For example, the channel layer CH may include polysilicon.

The memory layer ML may surround a channel layer CH. The memory layer ML may extend in the third direction D3 and, as such, may extend through the conductive patterns CP and the insulating patterns IP of the gate stack structure GST. The memory layer ML may be surrounded by the conductive patterns CP and the insulating patterns IP of the gate stack structure GST.

The memory layer ML may include a tunnel insulating layer TU surrounding the channel layer CH, a charge storage layer DA surrounding the tunnel insulating layer TU, and a blocking layer BLK surrounding the charge storage layer DA. Each of the tunnel insulating layer TU, the charge storage layer DA, and the blocking layer BLK may extend through the conductive patterns CP and the insulating patterns IP of the gate stack structure GST. The lower source layer LSL of the source structure SOT may be connected to the channel layer CH while extending through the tunnel insulating layer TU, the charge storage layer DA, and the blocking layer BLK of the memory layer ML. The tunnel insulating layer TU may include a material allowing tunneling of a charge therethrough. For example, the tunnel insulating layer TU may include silicon oxide. The charge storage layer DA may include a material capable of storing a charge therein. For example, the charge storage layer DA may include silicon nitride. The blocking layer BLK may include a material capable of preventing movement of a charge therethrough. For example, the blocking layer BLK may include silicon oxide.

The support structures SUS may be disposed, e.g., only, in the extension region ER, e.g., among the extension region ER and the cell region CR. The support structures SUS may extend in the third direction D3 and, as such, may extend through the conductive patterns CP and the insulating patterns IP of the gate stack structure GST and through the upper source layer USL and the first to third dummy layers DL1, DL2 and DL3 of the source structure SOT. The support structures SUS may penetrate the gate stack structure GST and the source structure SOT. At least one of the support structures SUS may extend through the second insulating layer 120. At least one of the support structures SUS may extend through the step top surface STET of the staircase structure STE. The support structures SUS may be surrounded by the conductive patterns CP and the insulating patterns IP of the gate stack structure GST. A lowermost portion of the support structure SUS may be disposed in the semiconductor layer 200.

Each of the support structures SUS may include an outer support layer OSU, an inner support layer ISU, and a support pattern SUP. The outer support layer OSU may extend in the third direction D3 and, as such, may extend through the conductive patterns CP and the insulating patterns IP of the gate stack structure GST and through the upper source layer USL and the first to third dummy layers DL1, DL2 and DL3 of the source structure SOT. The outer support layer OSU may contact side walls of the conductive patterns CP, side walls of the insulating patterns IP, a side wall of the upper source layer USL, and side walls of the first to third dummy layers DL1, DL2 and DL3. The outer support layer OSU may have the same height as the blocking layer BLK of the memory channel structure MCS, e.g., relative to a bottom of the substrate 100. Levels of a top surface of the outer support layer OSU and a top surface of the blocking layer BLK may be equal, and levels of a bottom surface of the outer support layer OSU and a bottom surface of the blocking layer BLK may be equal. In exemplary embodiments, the outer support layer OSU may include the same material as the blocking layer BLK. For example, the outer support layer OSU may include silicon oxide.

The inner support layer ISU may be provided inside the outer support layer OSU. For example, as illustrated in FIG. 5C, the outer support layer OSU may extend conformally, e.g., and continuously, on entire sidewalls and bottoms of vertical openings through the gate stack structure GST and the source structure SOT, and the inner support layer ISU may extend conformally, e.g., and continuously, on parts of sidewalls and entire bottoms of the outer support layer OSU. An outer side wall of the inner support layer ISU may contact an inner side wall of the outer support layer OSU. The inner support layer ISU may be surrounded by the outer support layer OSU. The inner support layer ISU may extend in the third direction D3 and, as such, may extend through the conductive patterns CP and the insulating patterns IP of the gate stack structure GST and through the upper source layer USL and the first to third dummy layers DL1, DL2 and DL3 of the source structure SOT. The inner support layer ISU may include an insulating material. For example, the inner support layer ISU may include an oxide.

A first cavity CA1 may be defined by the inner support layer ISU. The first cavity CA1 may be a closed empty space provided inside the inner support layer ISU, e.g., the first cavity CA1 may be completely enclosed by the inner support layer ISU. The first cavity CA1 may be shielded from an outside thereof by the inner support layer ISU. The first cavity CA1 may extend through the conductive patterns CP and the insulating patterns IP of the gate stack structure GST and through the upper source layer USL and the first to third dummy layers DL1, DL2 and DL3 of the source structure SOT.

The support pattern SUP may be provided between the outer support layer OSU and the inner support layer ISU. The support pattern SUP may be disposed, e.g., only, at an uppermost portion of the support structure SUS. In exemplary embodiments, the support pattern SUP may include a material having etch selectivity with respect to a material included in the outer support layer OSU. For example, when the outer support layer OSU includes silicon oxide, the support pattern SUP may include silicon nitride.

The memory cell structure CST may further include an upper separation line SDS. The upper separation line SDS may be disposed in the cell region CR. The upper separation line SDS may extend in the second direction D2. The upper separation line SDS may extend through the conductive patterns CP disposed at an upper portion of the gate stack structure GST. The conductive patterns CP, through which the upper separation line SDS extends, may be gate upper lines. The upper separation line SDS may include an insulating material. For example, the upper separation line SDS may include an oxide.

The memory cell structure CST may further include separation structures WDS. The separation structures WDS may extend in the second direction D2. The separation structures WDS may extend through the conductive patterns CP and the insulating patterns IP of the gate stack structure GST, e.g., the separation structures WDS may extend through an entire thickness of the gate stack structure GST in the third direction D3. In exemplary embodiments, the separation structure WDS may include a source contact electrically connected to the source structure SOT, and spacers disposed at opposite sides of the source contact.

The memory cell structure CST may further include word line contacts WC. The word line contacts WC may be disposed in the extension region ER. The word line contacts WC may be electrically connected to the conductive patterns CP, respectively. The word line contacts WC may include a conductive material.

The bit line structure BST may be provided on the gate stack structure GST. The bit line structure BST may include a fourth insulating layer 140, bit line contacts BC, a fifth insulating layer 150, and bit lines 300.

The fourth insulating layer 140 may cover the gate stack structure GST, the memory channel structures MCS, and the support structures SUS. The fourth insulating layer 140 may cover top surfaces of the memory channel structures MCS and the support structures SUS. The fourth insulating layer 140 may include an insulating material.

Bit line contacts BC may be provided in the fourth insulating layer 140. The bit line contact BC may contact the pad PA of the memory channel structure MCS while extending through the fourth insulating layer 140. At least one of the memory channel structures MCS may not contact the bit line contact BC. The memory channel structures MCS not contacting the bit line contact BC may be defined as dummy memory channel structures. The bit line contacts BC may include a conductive material.

The fifth insulating layer 150 covering the fourth insulating layer 140 and the bit line contacts BC may be provided. The fifth insulating layer 150 may include an insulating material.

The bit lines 300 may be provided in the fifth insulating layer 150. The bit lines 300 may extend in the first direction D1. The bit lines 300 may be spaced apart from one another in the second direction D2. The bit line 300 may be electrically connected to the memory channel structure MCS via the bit line contact BC. The bit line 300 may include a conductive material.

Referring to FIGS. 5D and 5E, the support pattern SUP of the support structure SUS may include an outer side wall SUP_OS contacting an inner side wall OSU_IS of the outer support layer OSU, a first curved surface SUP_C1 contacting the inner support layer ISU, and a top surface SUP_T contacting a bottom surface of the fourth insulating layer 140. The support pattern SUP may contact an upper portion of the inner side wall OSU_IS of the outer support layer OSU, e.g., the outer side wall SUP_OS of the support pattern SUP may extend continuously along an entire perimeter of the upper portion of the inner side wall OSU_IS of the outer support layer OSU (as illustrated in the top view of FIG. 5E). The outer side wall SUP_OS and the top surface SUP_T of the support pattern SUP may be flat. The first curved surface SUP_C1 of the support pattern SUP may be curved. The first curved surface SUP_C1 of the support pattern SUP may be a bottom surface of the support pattern SUP, e.g., the first curved surface SUP_C1 may connect the outer side wall SUP_OS and the top surface SUP_T along a curved profile of the upper portion of the inner support layer ISU.

A width inside the first curved surface SUP_C1 of the support pattern SUP may be gradually increased as the level of the first curved surface SUP_C1 is lowered. For example, the width in the second direction D2 inside the first curved surface SUP_C1 may be defined as a first width W1, and may be gradually increased as the level of the first curved surface SUP_C1 is lowered. For example, as illustrated in FIG. 5D, a width between facing portions the first curved surface SUP_C1 along a direction parallel to an upper surface of the substrate 100 may gradually increase, as a distance from the fourth insulating layer 140 increases.

The inner support layer ISU may include a lower section ISU_L, e.g., directly, contacting the inner side wall OSU_IS of the outer support layer OSU, and an upper section ISU_U, e.g., directly, contacting the support pattern SUP. The lower section ISU_L of the inner support layer ISU refers to a portion disposed at a lower level than the upper section ISU_U of the inner support layer ISU, and does not refer a portion disposed at a lower level than a center of the inner support layer ISU. The inner support layer ISU may contact a lower portion of the inner side wall OSU_IS of the outer support layer OSU. The lower portion of the inner side wall OSU_IS of the outer support layer OSU refers to a portion disposed at a lower level than an upper portion of the inner side wall OSU_IS of the outer support layer OSU, and does not refer to a portion disposed at a lower level than a center of the inner side wall OSU_IS of the outer support layer OSU.

The upper section ISU_U of the inner support layer ISU may be surrounded by the support pattern SUP. The upper section ISU_U of the inner support layer ISU may be surrounded by the first curved surface SUP_C1. The upper section ISU_U of the inner support layer ISU may be provided inside the first curved surface SUP_C1 of the support pattern SUP. The upper section ISU_U of the inner support layer ISU may be disposed at the same level as the support pattern SUP. In other words, a portion of the upper section ISU_U of the inner support layer ISU and a portion of the support pattern SUP may be disposed at a particular level. The support pattern SUP may be disposed between the upper section ISU_U of the inner support layer ISU and the outer support layer OSU. The upper section ISU_U of the inner support layer ISU may extend through the support pattern SUP. The upper section ISU_U of the inner support layer ISU may be spaced apart from the outer support layer OSU by the support pattern SUP.

The inner support layer ISU may include a second curved surface ISU_C2 contacting the first curved surface SUP_C1 of the support pattern SUP, and the top surface ISU_T contacting the bottom surface of the fourth insulating layer 140. The top surface ISU_T of the inner support layer ISU may be surrounded by the top surface SUP_T of the support pattern SUP.

The first cavity CA1 may be defined by inner surfaces ISU_INS of the inner support layer ISU. The inner surfaces ISU_INS of the inner support layer ISU may be surfaces exposed by the first cavity CA1. An upper section CA1_U of the first cavity CA1 may be surrounded by the support pattern SUP. The upper section CA1_U of the first cavity CA1 may be surrounded by the upper section ISU_U of the inner support layer ISU. The upper section CA1_U of the first cavity CA1 may be provided inside the upper section ISU_U of the inner support layer ISU. The upper section CA1_U of the first cavity CA1 may be disposed at the same level as the support pattern SUP and the upper section ISU_U of the inner support layer ISU.

The top surface ISU_T of the inner support layer ISU, the top surface SUP_T of the support pattern SUP, and a top surface OSU_T of the outer support layer OSU may be coplanar. The top surface ISU_T of the inner support layer ISU, the top surface SUP_T of the support pattern SUP, and the top surface OSU_T of the outer support layer OSU may be flat. The top surface ISU_T of the inner support layer ISU, the top surface SUP_T of the support pattern SUP and the top surface OSU_T of the outer support layer OSU may contact the bottom surface of the fourth insulating layer 140. The second curved surface ISU_C2 of the inner support layer ISU may be curved, corresponding to the first curved surface SUP_C1 of the support pattern SUP. The second curved surface ISU_C2 of the inner support layer ISU may be connected to the top surface ISU_T of the inner support layer ISU.

In a semiconductor device according to exemplary embodiments of the disclosure, a support structure may not include a conductive material and, as such, it may be possible to prevent occurrence of electrical failure caused by the support structure in a process following a support structure formation process. In a semiconductor device according to exemplary embodiments of the disclosure, a cavity is provided at a support structure in accordance with incomplete filling of an insulating material in an interior of the support structure and, as such, manufacturing costs and manufacturing time of the semiconductor device may be reduced. In a semiconductor device according to exemplary embodiments of the disclosure, a support structure may include a support pattern and, as such, the size of a cavity in the support structure may be relatively great, and electrical characteristics of the semiconductor device may be enhanced.

FIGS. 6A, 6B, 7A, 7B, 8A, 8B, 9A, 9B, 10A, 10B, 11A, 11B, 12A, and 12B are cross-sectional views of a method of manufacturing a semiconductor device according to an exemplary embodiment. The cross-sections of FIGS. 6A, 6B, 7A, 7B, 8A, 8B, 9A, 9B, 10A, 10B, 11A, 11B, 12A, and 12B correspond to those of FIGS. 5B and 5C. FIG. 11C is an enlarged view of portion C2 of FIG. 11B, and FIG. 12C is an enlarged view of portion C3 of FIG. 12B.

Figure 6A:
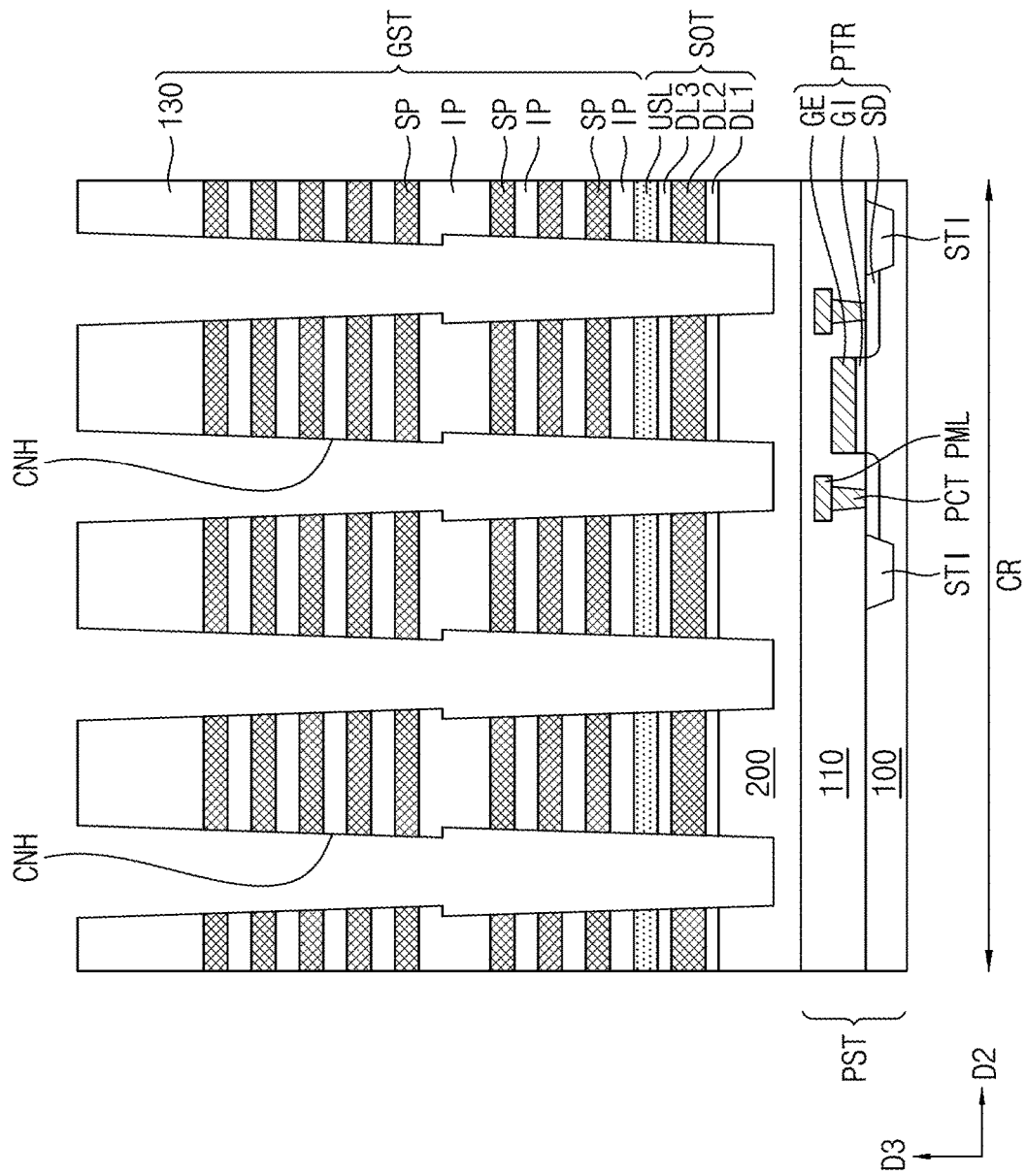
FIGS. 6A to 12C are views of stages in a method of manufacturing a semiconductor device according to an exemplary embodiment.
Figure 6B:
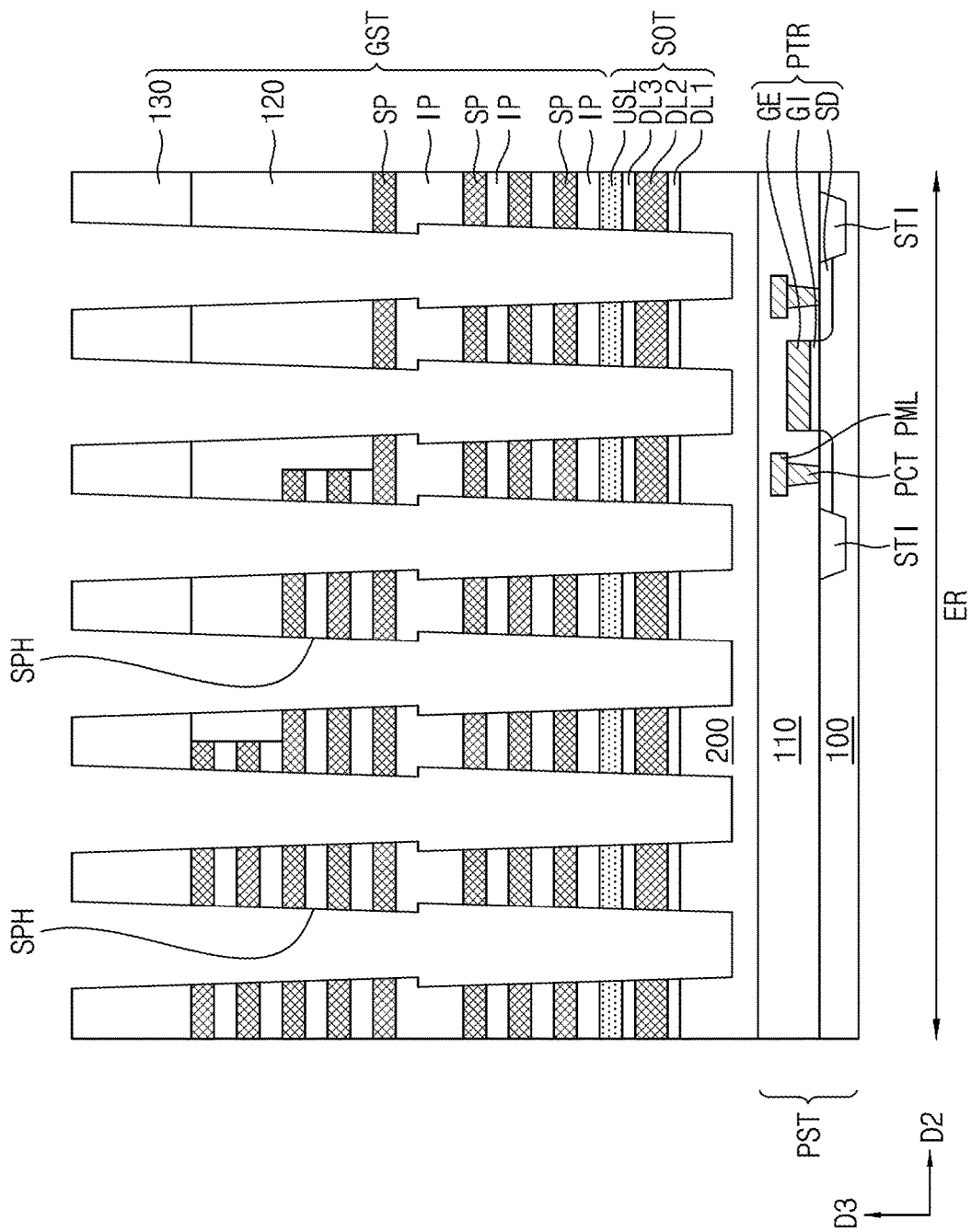

Referring to FIGS. 6A and 6B, the peripheral circuit structure PST may be formed. Formation of the peripheral circuit structure PST may include forming, on the substrate 100, the peripheral transistors PTR, the element isolation layers STI, the peripheral contacts PCT, the peripheral wirings PML, and the first insulating layer 110. The semiconductor layer 200 may be formed on the peripheral circuit structure PST.

The source structure SOT may be formed on the semiconductor layer 200. The source structure SOT may include the first dummy layer DL1, the second dummy layer DL2, the third dummy layer DL3, and the upper source layer USL which are sequentially stacked in the third direction D3. The first to third dummy layers DL1, DL2 and DL3 and the upper source layer USL of the source structure SOT may extend from the cell region CR to the extension region ER.

The gate stack structure GST, channel holes CNH, and support holes SPH may be formed. The channel holes CNH and the support holes SPH may extend in the third direction D3 and, as such, may extend through the gate stack structure GST and the source structure SOT. The channel holes CNH may be formed in the cell region CR. The support holes SPH may be formed in the extension region ER.

Formation of the gate stack structure GST, the channel holes CNH, and the support holes SPH may include alternately stacking first material layers and second material layers on the source structure SOT, patterning the first material layers and the second material layers in the extension region ER to have a staircase shape, forming the second insulating layer 120 and the third insulating layer 130, and forming the channel holes CNH and the support holes SPH. In accordance with extension of the channel holes CNH and the support holes SPH through the first material layers, the first material layers may be defined as insulating patterns IP. In accordance with extension of the channel holes CNH and the support holes SPH through the second material layers, the second material layers may be defined as the sacrificial patterns SP. The sacrificial patterns SP may include a material having etch selectivity with respect to a material included in the insulating patterns IP. For example, the sacrificial patterns SP may include a nitride. In exemplary embodiments, the gate stack structure GST, the channel holes CNH, and the support holes SPH may be formed in accordance with a double stack formation process.

In accordance with formation of the channel holes CNH and the support holes SPH, side walls of the sacrificial patterns SP, side walls of the insulating patterns IP, side walls of the upper source layer USL, side walls of the first to third dummy layers DL1, DL2 and DL3, and the semiconductor layer 200 may be exposed through the channel holes CNH and the support holes SPH.

Figure 7A:
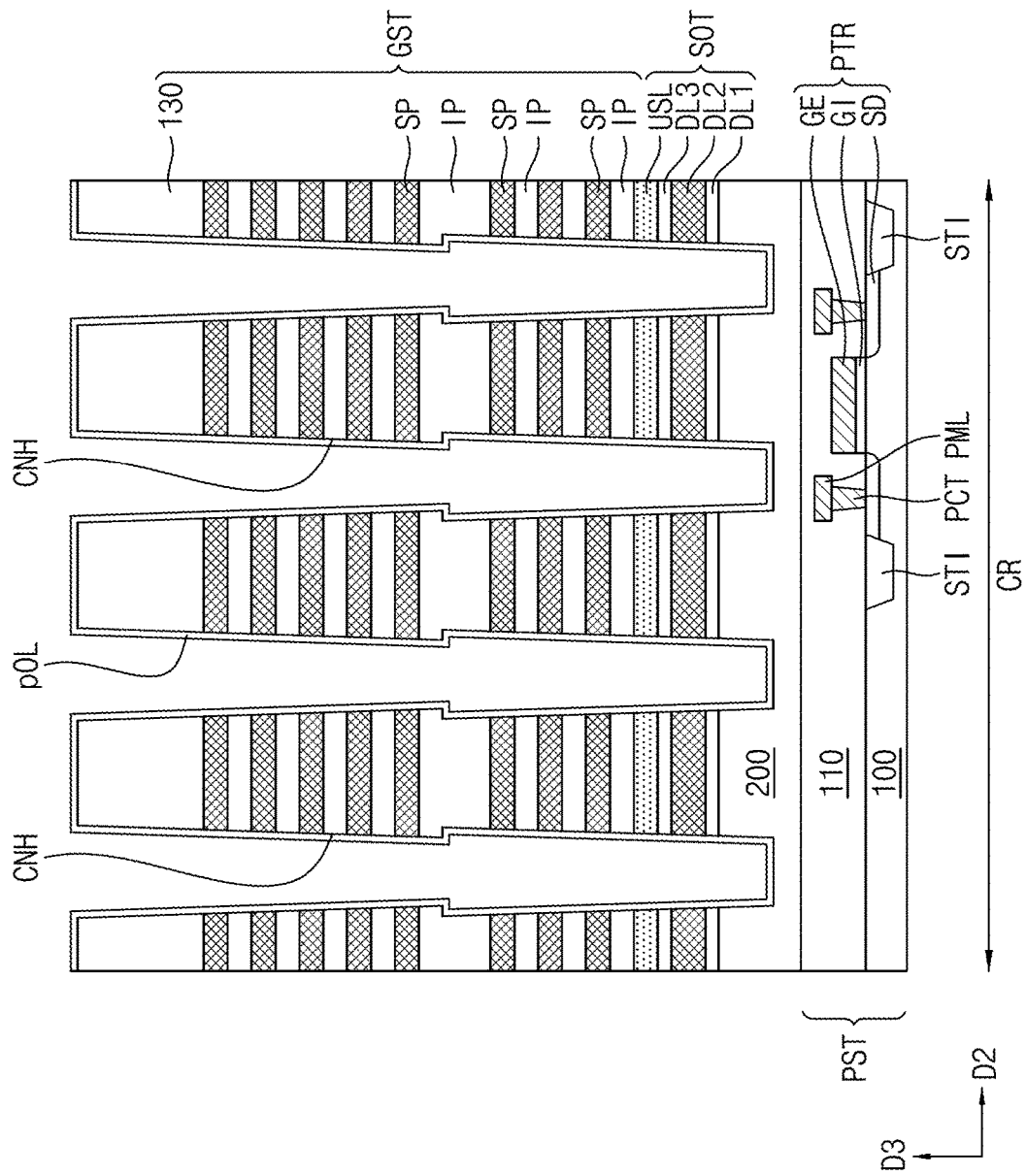
Figure 7B:
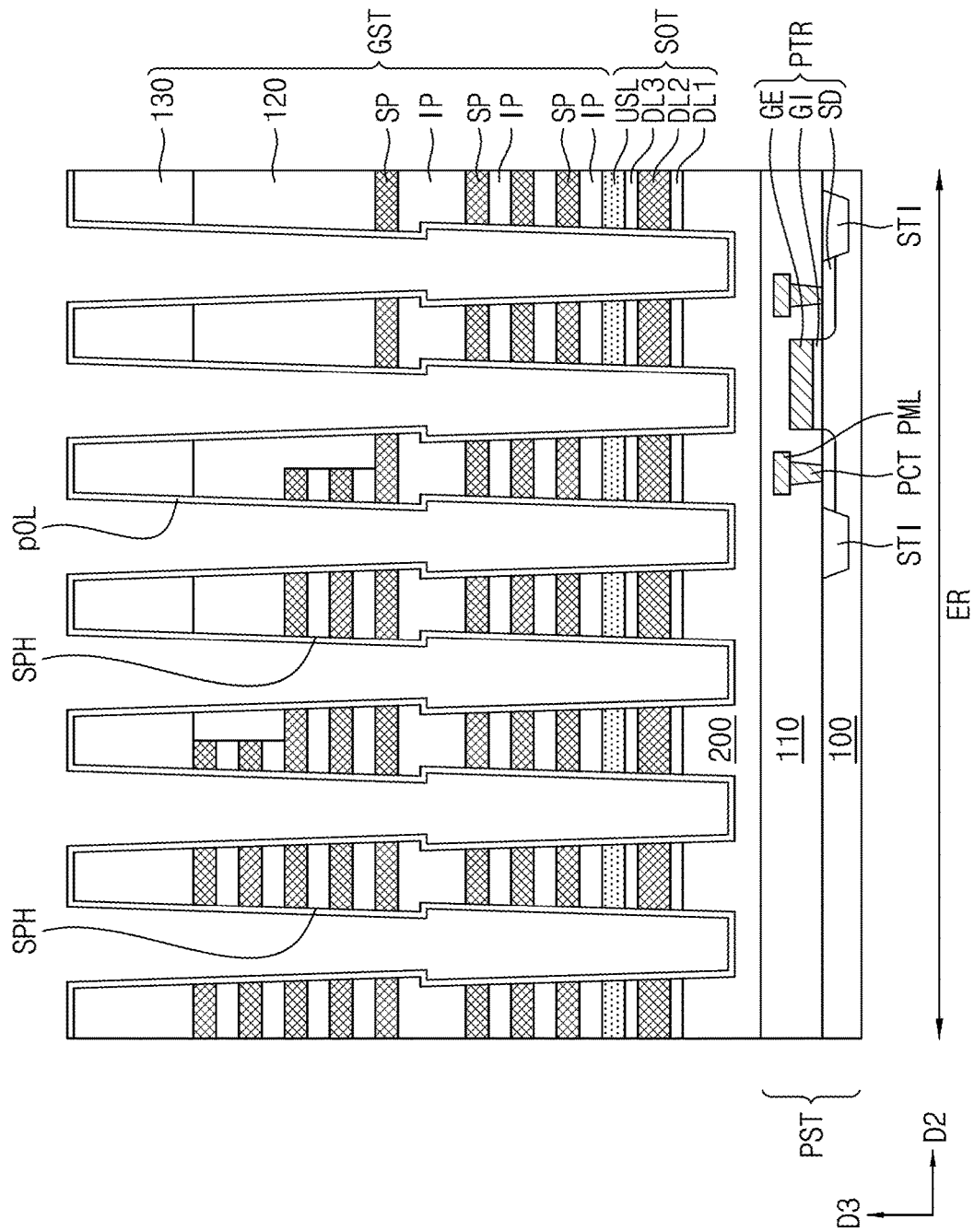

Referring to FIGS. 7A and 7B, a preliminary outer layer pOL may be conformally formed on the gate stack structure GST. The preliminary outer layer pOL may cover the gate stack structure GST. Portions of the preliminary outer layer pOL may be formed in the channel holes CNH and the support holes SPH, respectively. The preliminary outer layer pOL may cover the side walls of the sacrificial patterns SP, the side walls of the insulating patterns IP, the side walls of the upper source layer USL, the side walls of the first to third dummy layers DL1, DL2 and DL3, and the semiconductor layer 200 exposed through the channel holes CNH and the support holes SPH. The preliminary outer layer pOL may include an insulating layer. For example, the preliminary outer layer pOL may include silicon oxide.

Figure 8A:
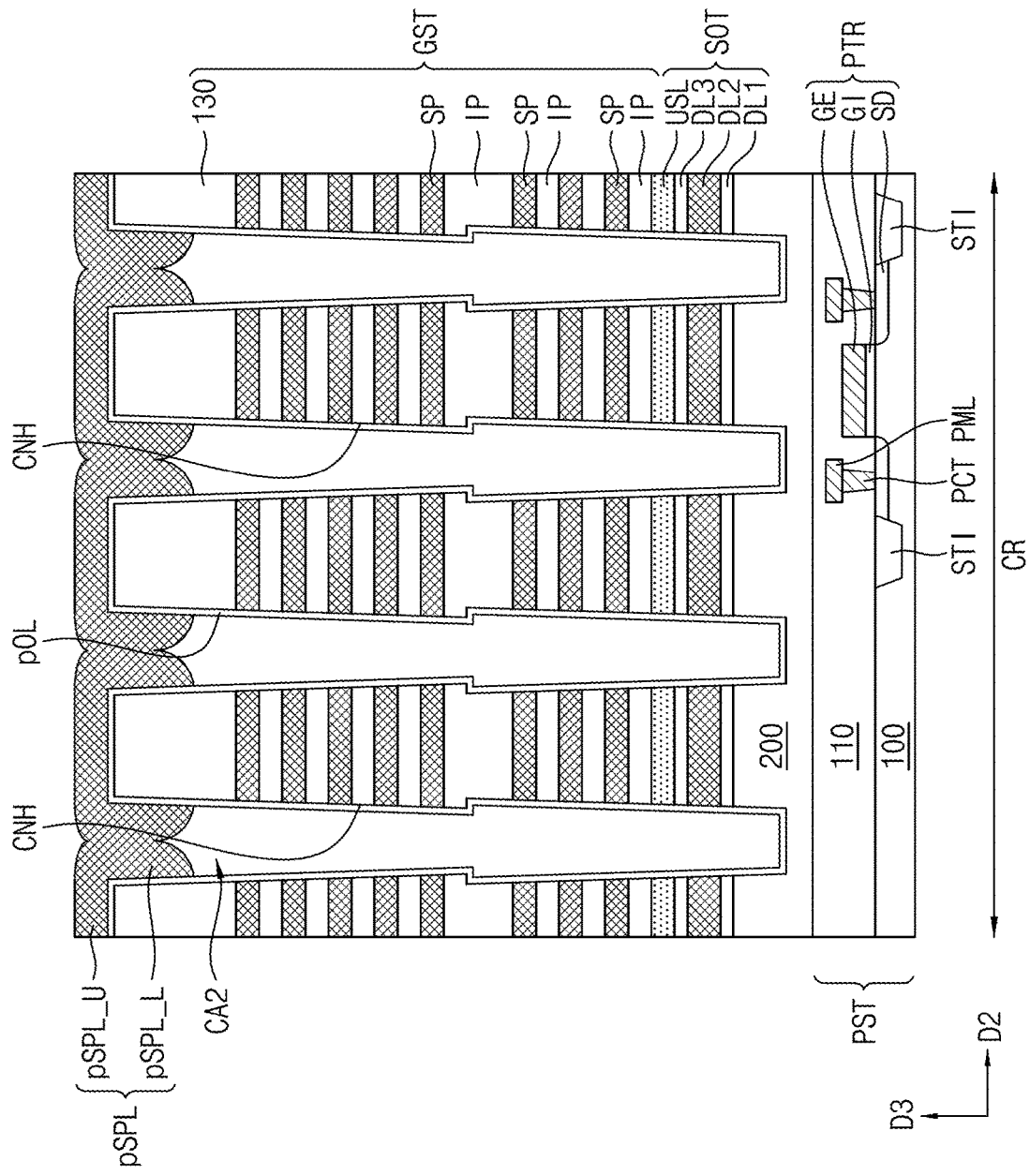
Figure 8B:
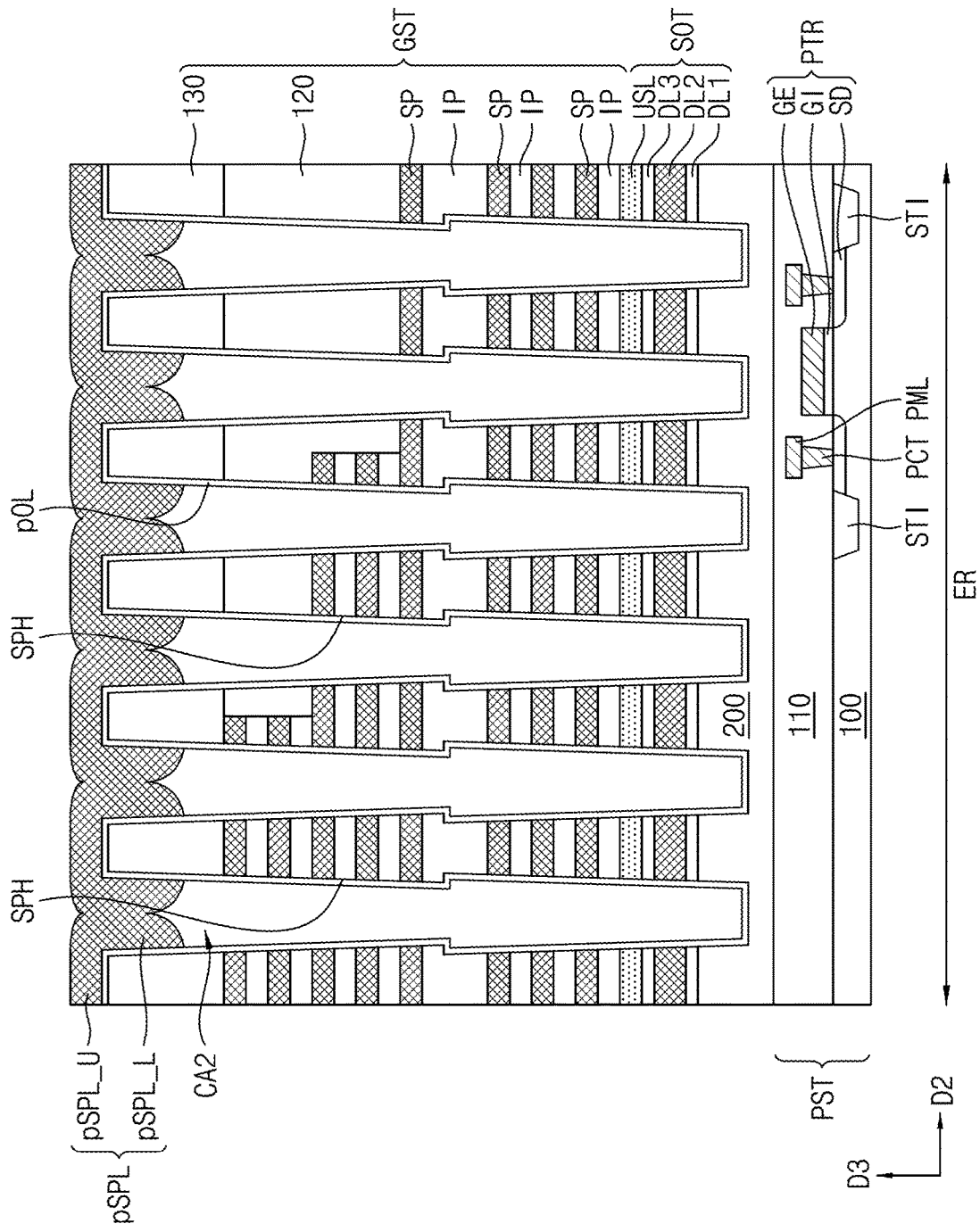

Referring to FIGS. 8A and 8B, a preliminary support pattern layer pSPL may be formed. In exemplary embodiments, the preliminary support pattern layer pSPL may be formed using a formation process having relatively poor step coverage, e.g., so material may be deposited on the top surface of the gate stack structure GST and only on the upper portions of the sidewalls of the channel holes CNH and the support holes SPH that horizontally overlap the third insulating layer 130. For example, the preliminary support pattern layer pSPL may be formed using physical vapor deposition (PVD) or chemical vapor deposition (CVD). The preliminary support pattern layer pSPL may include a material having etch selectivity with respect to a material included in the preliminary outer layer pOL. For example, when the preliminary outer layer pOL includes silicon oxide, the preliminary support pattern layer pSPL may include silicon nitride.

The preliminary support pattern layer pSPL may be formed on the preliminary outer layer pOL. The preliminary support pattern layer pSPL may include an upper section pSPL_U and lower sections pSPL_L. The upper section pSPL_U of the preliminary support pattern layer pSPL may be a portion disposed at a higher level than the gate stack structure GST. The lower sections pSPL_L of the preliminary support pattern layer pSPL may protrude into the channel holes CNH and the support holes SPH, respectively. Each lower section pSPL_L of the preliminary support pattern layer pSPL may protrude from the upper sections pSPL_U of the preliminary support pattern layer pSPL in a direction opposite to the third direction D3, e.g., directed from the upper sections pSPL_U toward the substrate 100. The channel holes CNH and the support holes SPH may be closed by the preliminary support pattern layer pSPL, e.g., tops of the channel holes CNH and the support holes SPH may be completely sealed by the preliminary support pattern layer pSPL. The channel holes CNH and the support holes SPH may be closed by the lower sections pSPL_L of the preliminary support pattern layer pSPL, respectively. A closed empty space in each of the channel holes CNH and the support holes SPH may be defined as a second cavity CA2. The second cavity CA2 may be defined by an inner surface of the preliminary outer layer pOL and a bottom surface of the lower section pSPL_L of the preliminary support pattern layer pSPL. The bottom surface of the lower section pSPL_L of the preliminary support pattern layer pSPL may be curved.

Figure 9B:
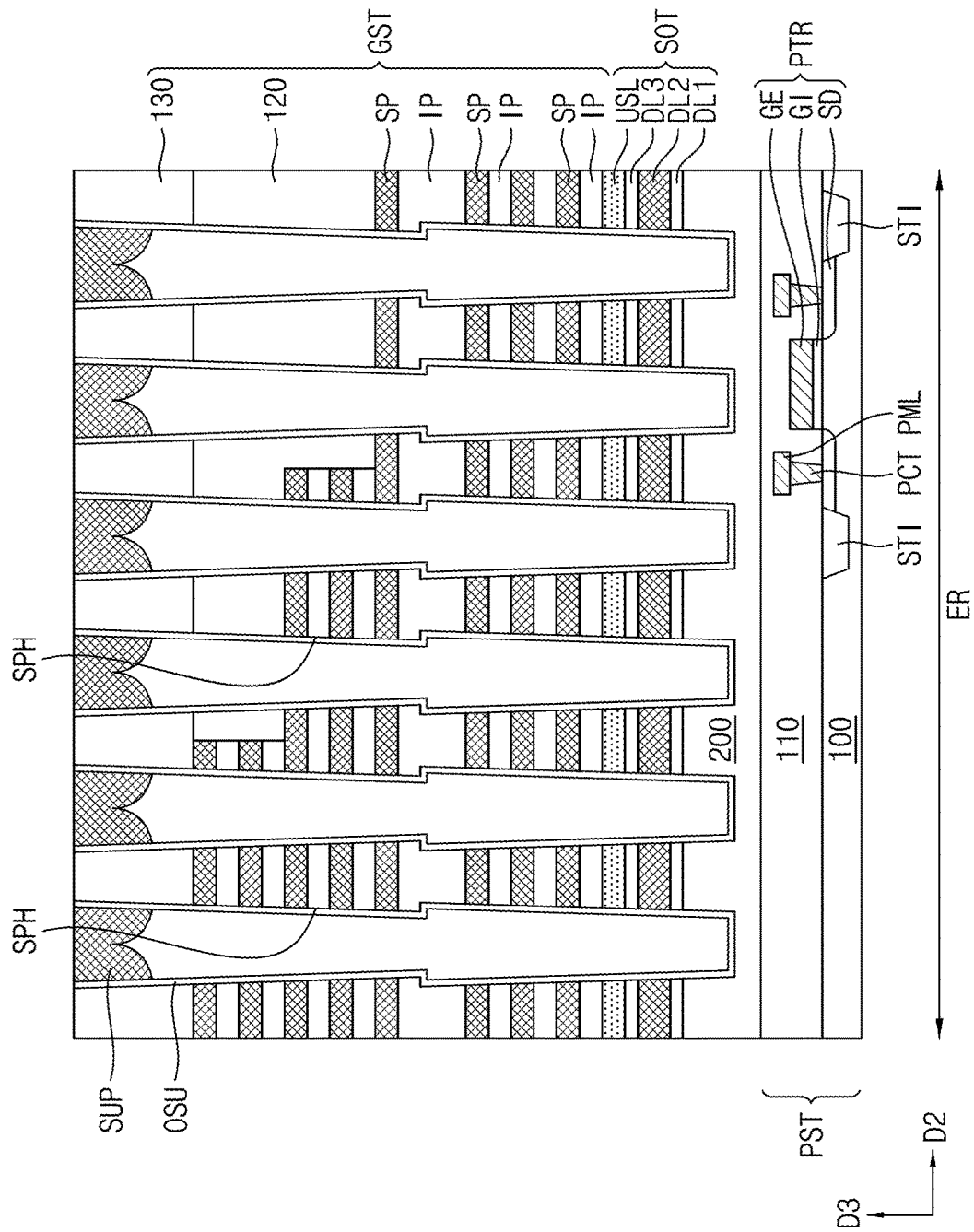

Referring to FIGS. 9A and 9B, the upper section pSPL_U of the preliminary support pattern layer pSPL and an upper portion of the preliminary outer layer pOL may be removed. In exemplary embodiments, the upper section pSPL_U of the preliminary support pattern layer pSPL and the upper portion of the preliminary outer layer pOL may be simultaneously removed. For example, the upper section pSPL_U of the preliminary support pattern layer pSPL and the upper portion of the preliminary outer layer pOL may be simultaneously removed by a chemical mechanical polishing (CMP) process.

As the upper section pSPL_U of the preliminary support pattern layer pSPL is removed, the lower sections pSPL_L of the preliminary support pattern layer pSPL may be separated from one another, e.g., so each of the lower sections pSPL_L may be completely within a respective one of the channel holes CNH and the support holes SPH. The separated lower sections pSPL_L of the preliminary support pattern layer pSPL may be defined as the support patterns SUP. The support patterns SUP may be provided in the channel holes CNH and the support holes SPH, respectively. The support patterns SUP may be disposed at upper portions of the channel holes CNH and the support holes SPH, respectively, e.g., the support patterns SUP may overlap horizontally only the third insulating layer 130 among all the layers of the gate stack structure GST. The support pattern SUP in the channel hole CNH may be defined as a first support pattern, and the support pattern SUP in the support hole SPH may be defined as a second support pattern.

As the upper portion of the preliminary outer layer pOL is removed, the preliminary outer layer pOL may be divided into blocking layers BLK and outer support layers OSU. A portion of the preliminary outer layer pOL remaining in the channel hole CNH may be defined as the blocking layer BLK. A portion of the preliminary outer layer pOL remaining in the support hole SPH may be defined as the outer support layer OSU.

Figure 10A:
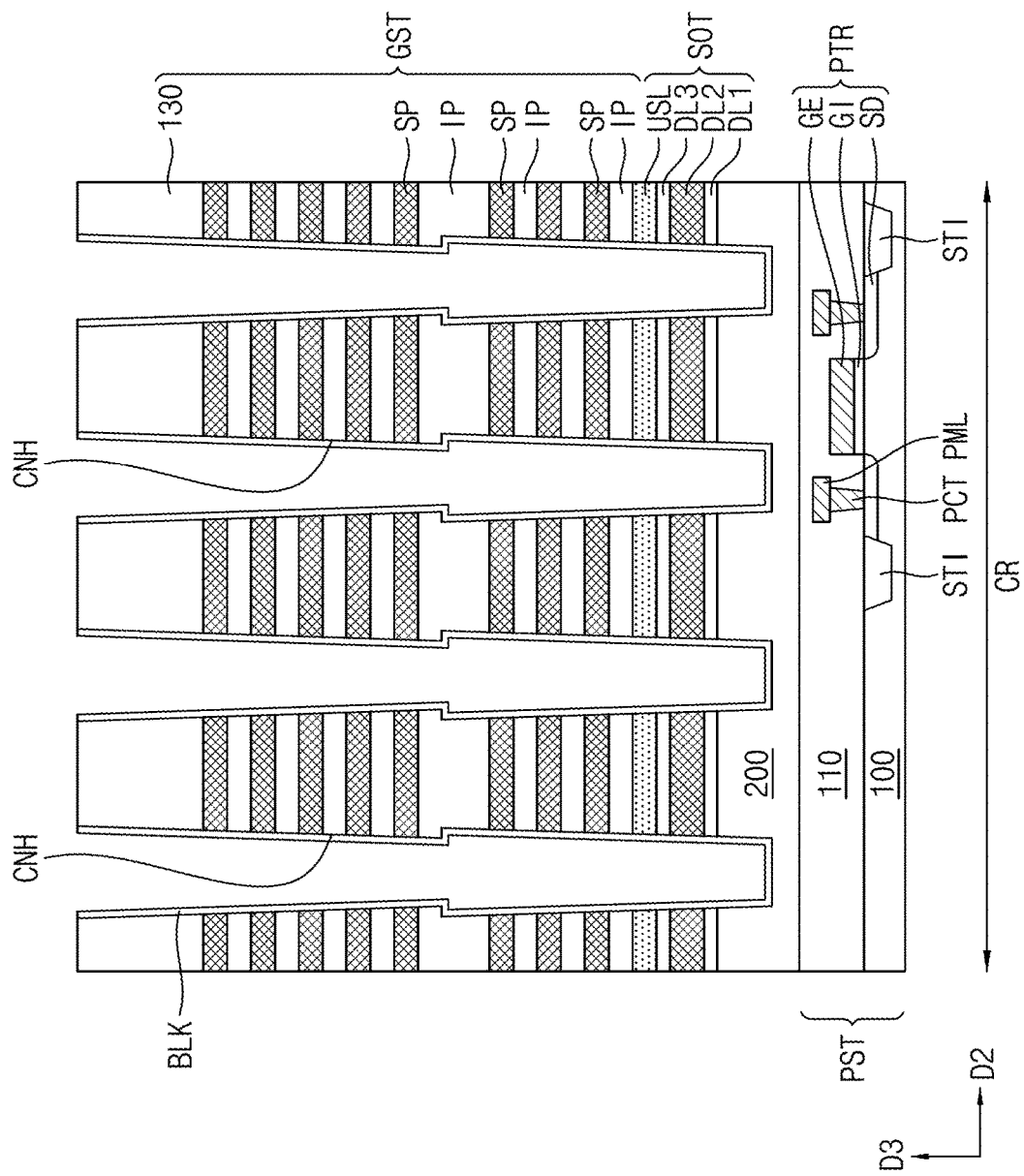
Figure 10B:
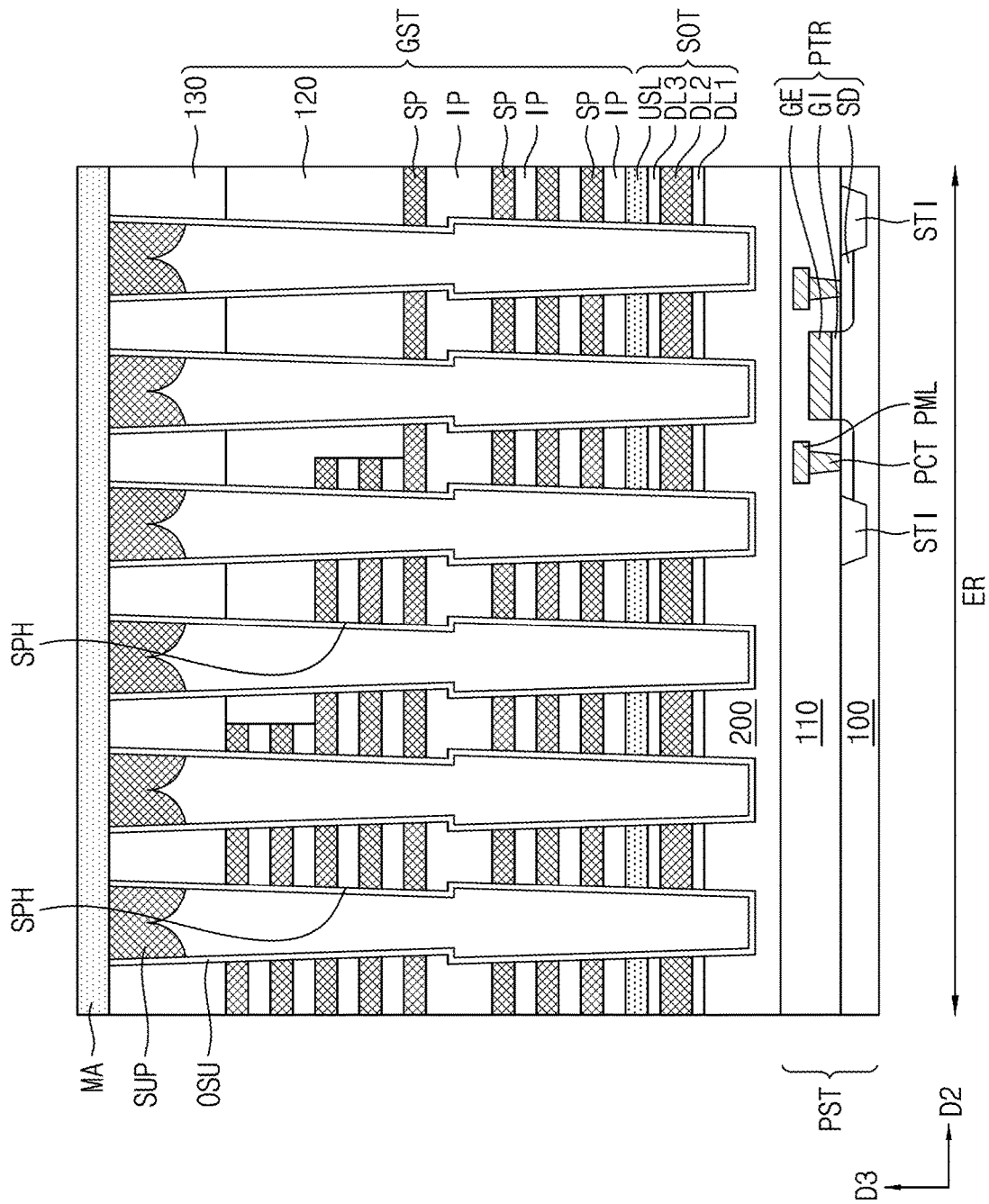

Referring to FIGS. 10A and 10B, the support patterns SUP in the channel holes CNH may be removed. As the support patterns SUP in the channel holes CNH are removed, the channel holes CNH may be opened. Removal of the support patterns SUP in the channel holes CNH may include forming a mask layer MA covering the support patterns SUP in the support holes SPH and exposing the support patterns SUP in the channel holes CNH, and etching the support patterns SUP in the channel holes CNH using the mask layer MA as an etch mask.

Figure 11A:
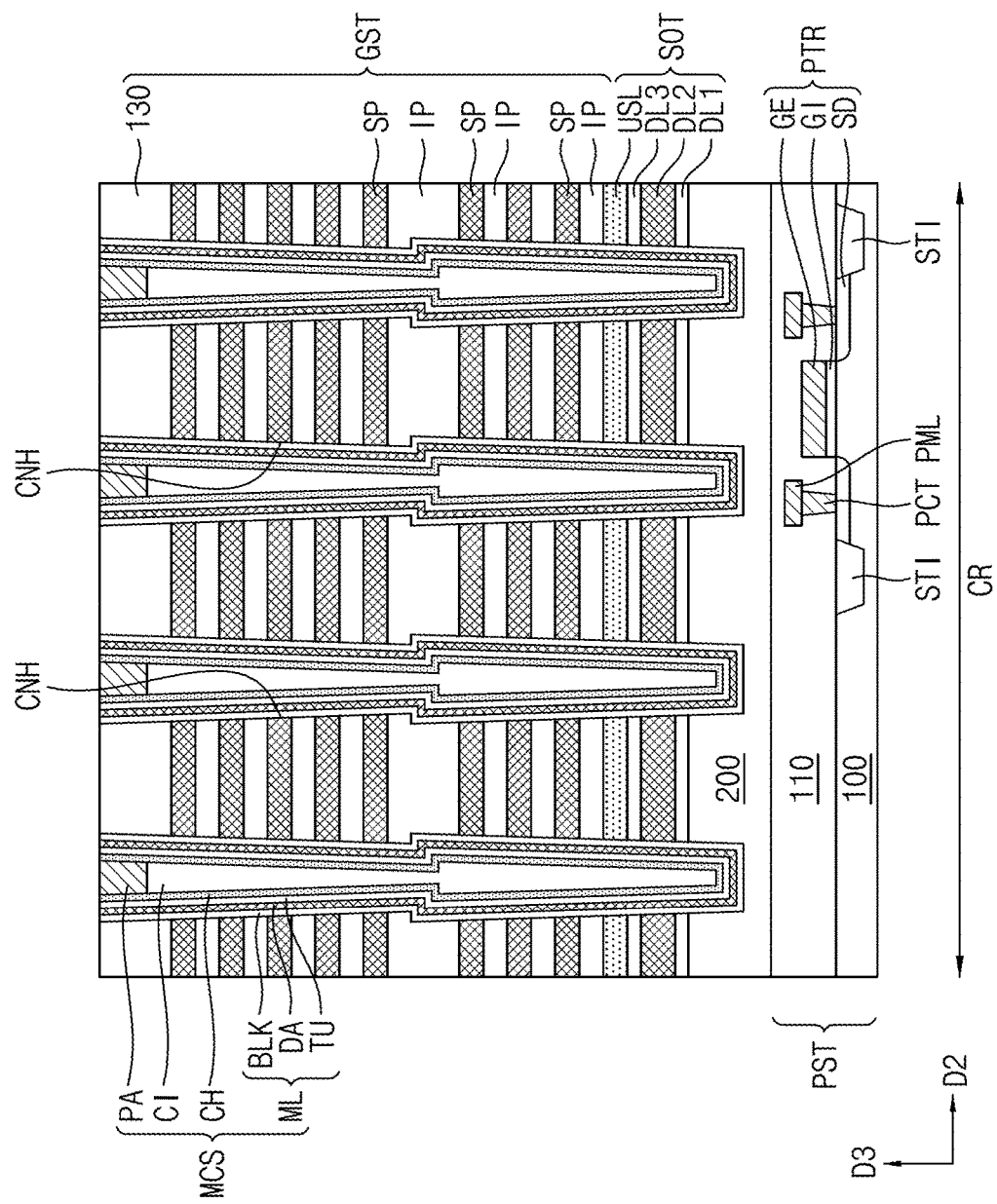
Figure 11B:
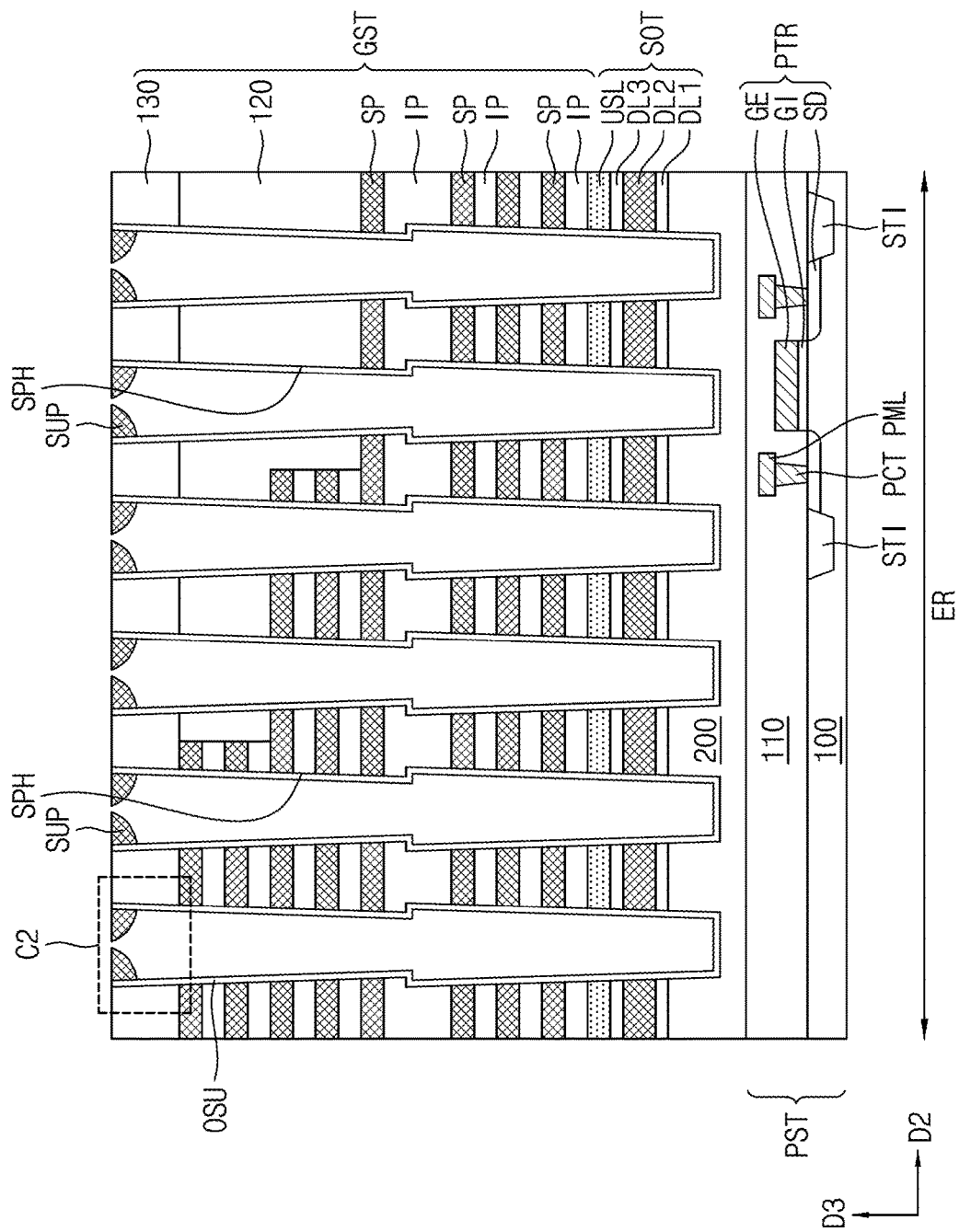
Figure 11C:
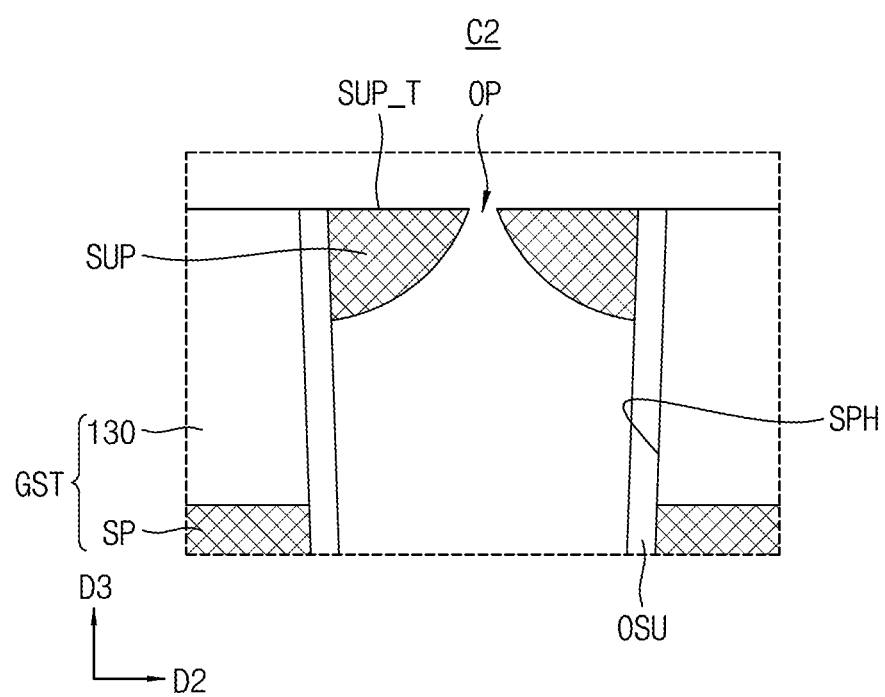

Referring to FIGS. 11A, 11B and 11C, the memory channel structures MCS may be formed. The memory channel structures MCS may be formed in the channel holes CNH, respectively. Formation of the memory channel structures MCS may include sequentially forming, in the channel hole CNH, the charge storage layer DA, the tunnel insulating layer TU, the channel layer CH, the core insulating layer CI, and the pad PA. In exemplary embodiments, the mask layer MA may be removed before formation of the memory channel structures MCS.

An upper portion of the support pattern SUP in the support hole SPH may be removed. In exemplary embodiments, the upper portion of the support pattern SUP in the support hole SPH may be removed by a chemical mechanical polishing (CMP) process. In exemplary embodiments, the upper portion of the support pattern SUP in the support hole SPH may be removed by an etch-back process. In exemplary embodiments, an upper portion of the channel structure MCS and an upper portion of the third insulating layer 130 may be removed together with the upper portion of the support pattern SUP in the support hole SPH.

As the upper portion of the support pattern SUP in the support hole SPH is removed, the support hole SPH may again be opened. In accordance with removal of the upper portion of the support pattern SUP in the support hole SPH, an opening OP may be formed. The opening OP may be surrounded by the remaining bottom portion of the support pattern SUP. The remaining bottom portion of the support pattern SUP may have the form of a ring defined with the opening OP at a central portion thereof. The support hole SPH may be connected to, e.g., in fluid communication with, an outside thereof through the opening OP. In exemplary embodiments, the level of a top surface SUP_T of the support pattern SUP may be equal to the level of a top surface of the pad PA of the memory channel structure MCS.

Figure 12A:
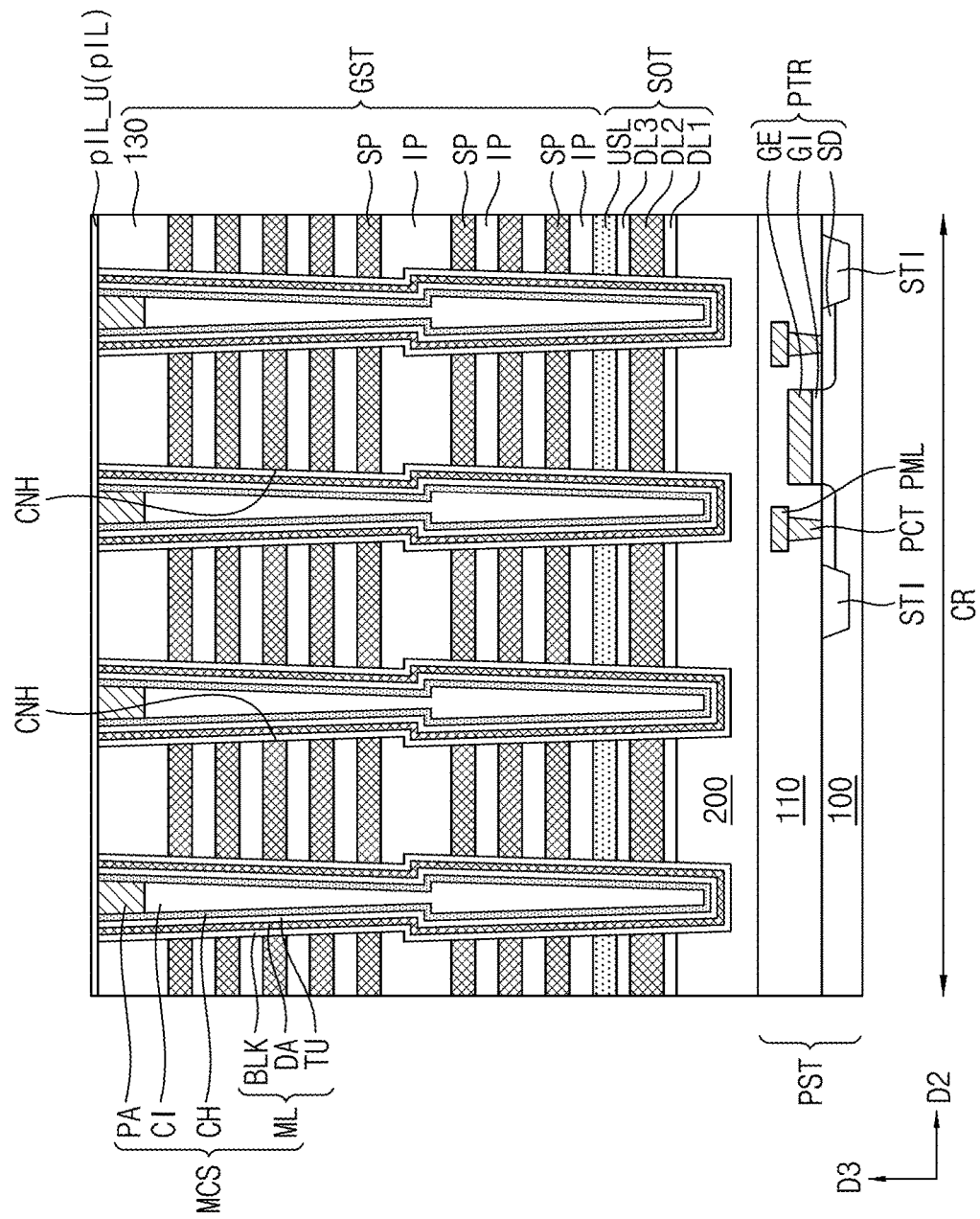
Figure 12B:
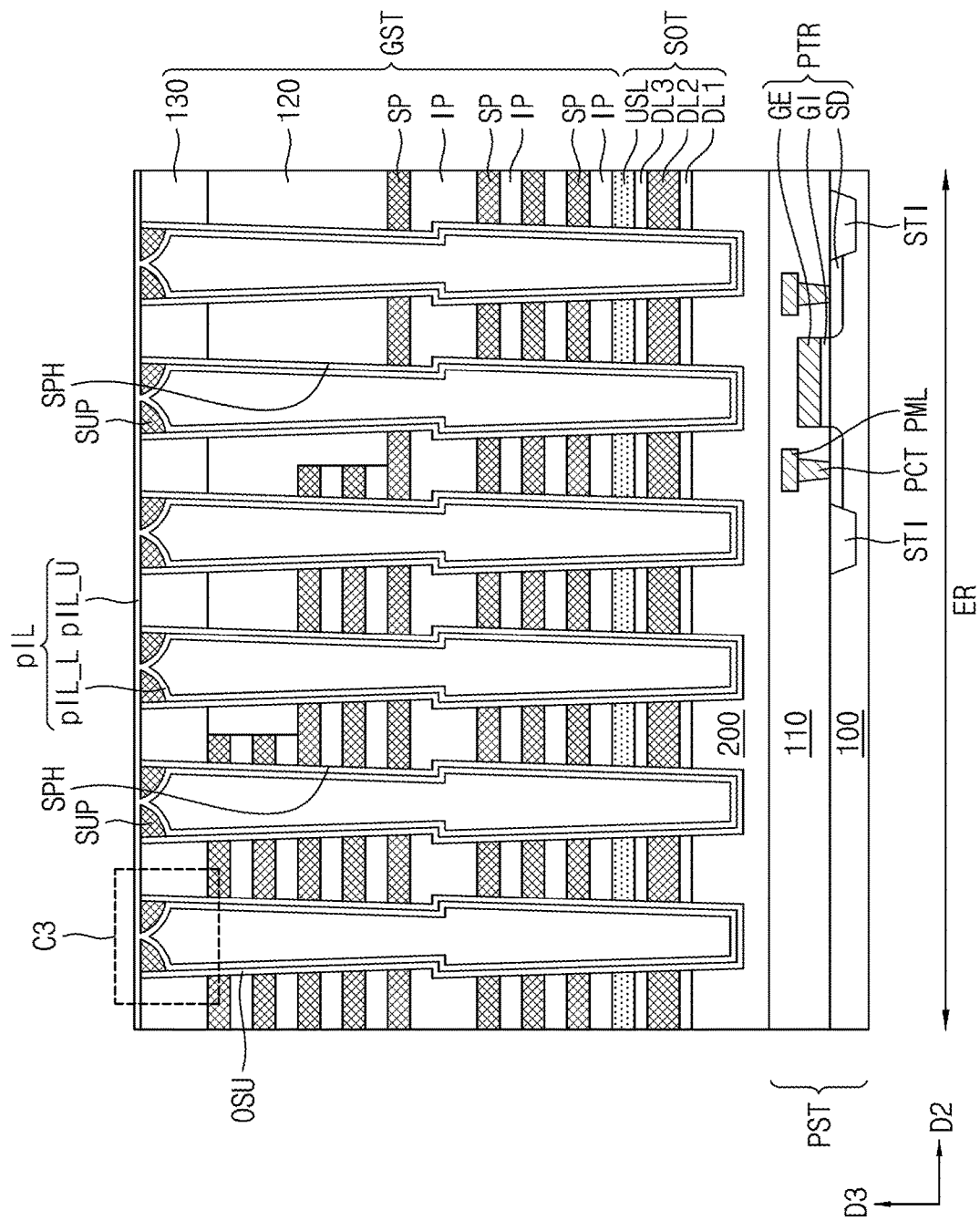
Figure 12C:
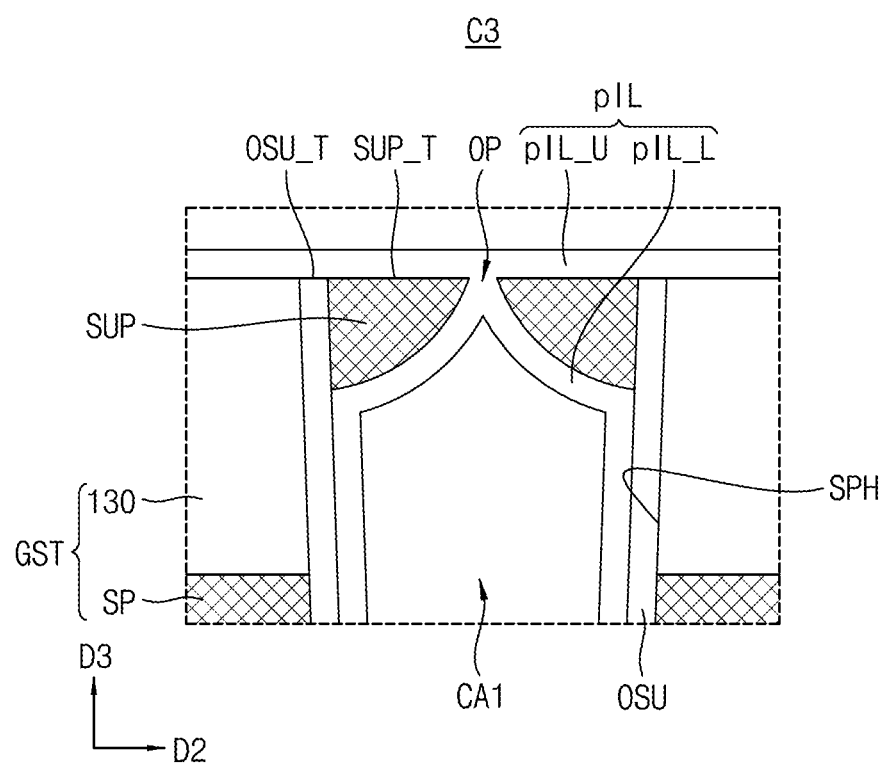

Referring to FIGS. 12A, 12B and 12C, a preliminary inner layer pIL may be formed. Formation of the preliminary inner layer pIL may include depositing a deposition material toward the gate stack structure GST. For example, the preliminary inner layer pIL may be formed through an atomic layer deposition process.

The preliminary inner layer pIL may include an upper section pIL_U and lower sections pIL_L. The upper section pIL_U of the preliminary inner layer pIL may be disposed at a higher level than the third insulating layer 130 of the gate stack structure GST, the memory channel structures MCS and the support patterns SUP. The upper section pIL_U of the preliminary inner layer pIL may contact a top surface of the third insulating layer 130 of the gate stack structure GST, a top surface of the memory channel structures MCS, the top surface SUP_T of the support pattern SUP, and a top surface OSU_T of the outer support layer OSU.

The lower sections pIL_L of the preliminary inner layer pIL may be provided in the support holes SPH, respectively. The lower section pIL_L of the preliminary inner layer pIL may be conformally formed on the support pattern SUP and the outer support layer OSU. The lower section pIL_L of the preliminary inner layer pIL may be formed as a deposition material is deposited in the support hole SPH through the opening OP.

The support hole SPH may be closed by the lower section pIL_L of the preliminary inner layer pIL. The opening OP connecting the support hole SPH to an outside thereof may be closed by the preliminary inner layer pIL. A closed empty space in the support hole SPH may be defined as the first cavity CA1. The first cavity CA1 may be defined by an inner surface of the lower section pIL_L of the preliminary inner layer pIL.

Referring to FIGS. 5A, 5B and 5C, the upper section pIL_U of the preliminary inner layer pIL may be removed. In exemplary embodiments, the upper section pIL_U of the preliminary inner layer pIL may be removed by a chemical mechanical polishing (CMP) process.

As the upper section pIL_U of the preliminary inner layer pIL is removed, the lower sections pIL_L of the preliminary inner layer pIL may be separated from one another. The separated lower sections pIL_L of the preliminary inner layer pIL may be defined as the inner support layers ISU. As the inner support layer ISU is formed, the support structure SUS, which includes the inner support layer ISU, the outer support layer OSU, and the support pattern SUP, may be defined.

The upper separation line SDS extending through the sacrificial patterns SP disposed at an upper portion of the gate stack structure GST may be formed. The fourth insulating layer 140, the bit line contacts BC, the fifth insulating layer 150, and the bit lines 300 may be formed on the gate stack structure GST, the memory channel structures MCS and the support structures SUS.

The sacrificial patterns SP may be substituted by the conductive patterns CP, and the first to third dummy layers DL1, DL2 and DL3 in the cell region CR may be substituted by the lower source layer LSL. After formation of the conductive patterns CP and the lower source layer LSL, separation structures WDS may be formed.

A semiconductor device manufacturing method according to exemplary embodiments of the disclosure may include forming a support pattern. Therefore, it may be possible to reduce costs and time of a process for closing a support hole through formation of a preliminary inner layer.

Figure 13A:
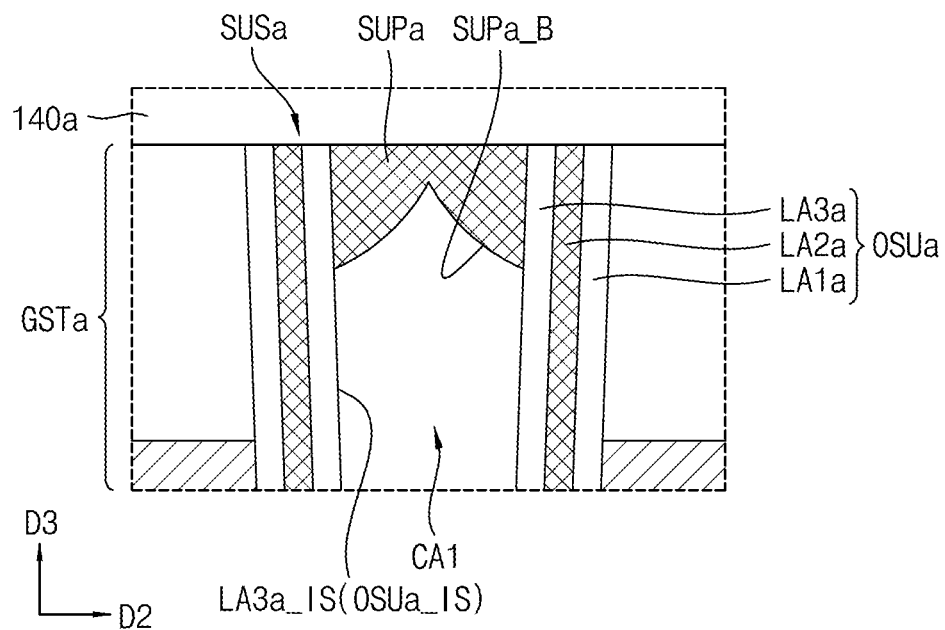
FIGS. 13A and 13B are views of a support structure of a semiconductor device according to an exemplary embodiment.
Figure 13B:
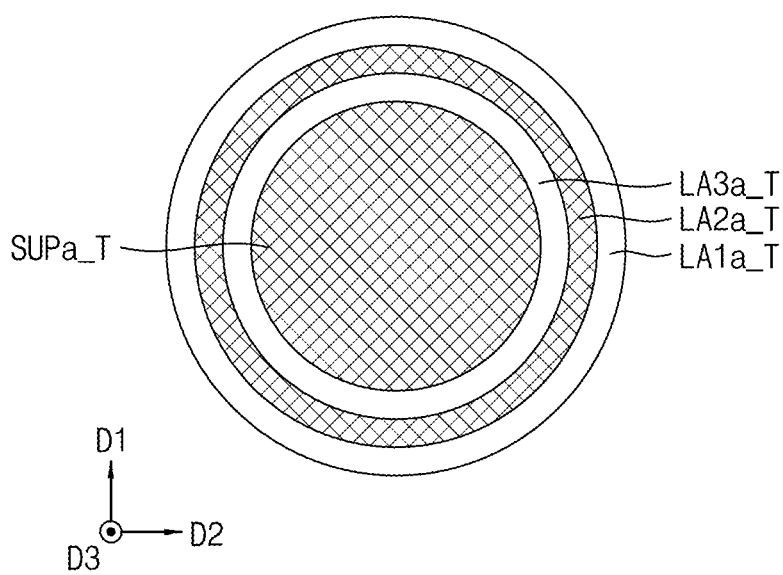

FIGS. 13A and 13B are a cross-sectional view and a top view, respectively, of a support structure of a semiconductor device according to an exemplary embodiment of the disclosure. The view in FIGS. 13A and 13B correspond to the views in FIGS. 5D and 5E, respectively.

Referring to FIGS. 13A and 13B, a support structure SUSa of a semiconductor device may include an outer support layer OSUa extending through a gate stack structure GSTa, and a support pattern SUPa surrounded by the outer support layer OSUa.

The outer support layer OSUa may include a first layer LA1a, a second layer LA2a inside the first layer LA1a, and a third layer LA3a inside the second layer LA2a. The second layer LA2a may surround the third layer LA3a, and the first layer LA1a may surround the second layer LA2a.

The third layer LA3a may include the same material as a tunnel insulating layer of a memory channel structure. For example, the third layer LA3a may include silicon oxide. The second layer LA2a may include the same material as a charge storage layer of the memory channel structure. For example, the second layer LA2a may include silicon nitride. The first layer LA1a may include the same material as a blocking layer of the memory channel structure. For example, the first layer LA1a may include silicon oxide.

A cavity CAa may be defined in the support structure SUSa. The cavity CAa may be a closed empty space in the support structure SUSa. The cavity CAa may be defined by an inner side wall OSUa_IS of an outer support layer OSUa (i.e., an inner side wall LA3a_IS of the third layer LA3a) and a bottom surface SUPa_B of the support pattern SUPa. An upper portion of the cavity CAa may be surrounded by the support pattern SUPa. The upper portion of the cavity CAa may be surrounded by the bottom surface SUPa_B of the support pattern SUPa.

A top surface SUPa_T of the support pattern SUPa, a top surface LA3a_T of the third layer LA3a, a top surface LA2a_T of the second layer LA2a, and a top surface LA1a_T of the first layer LA1a may contact a bottom surface of an insulating layer 140a covering the support structure SUSa. An outer side wall of the support pattern SUPa may contact an inner side wall LA3a_IS of the third layer LA3a.

The support pattern SUPa may include a material having etch selectivity with respect to a material included in the third layer LA3a. For example, when the third layer LA3a includes silicon oxide, the support pattern SUPa may include silicon nitride.

Figure 14A:
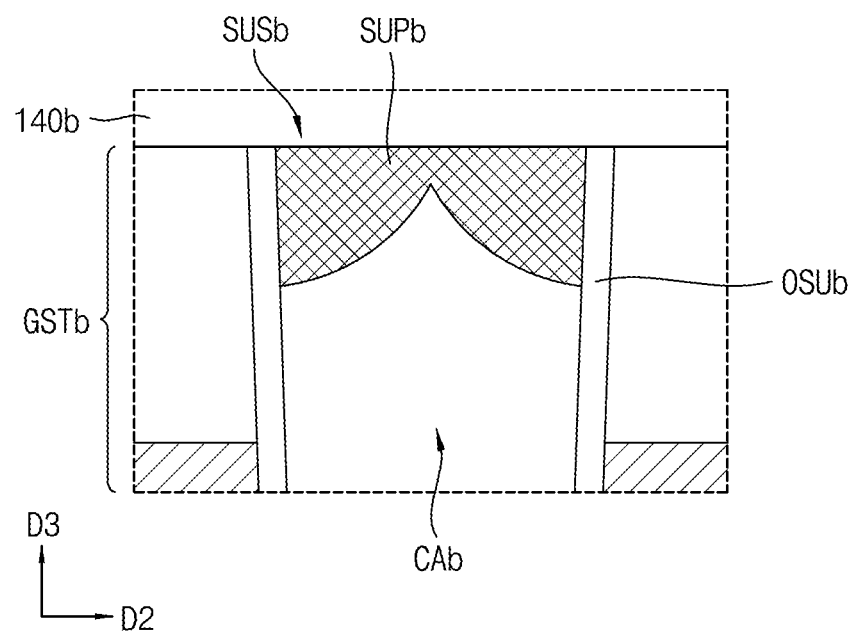
FIGS. 14A and 14B are views of a support structure of a semiconductor device according to an exemplary embodiment.
Figure 14B:
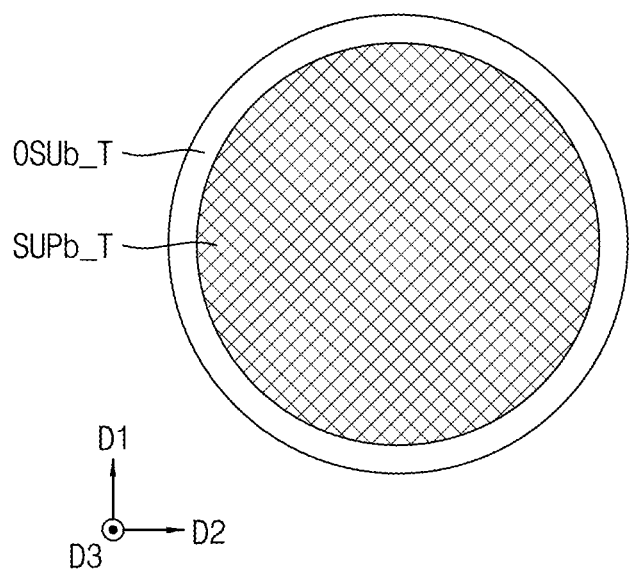

FIGS. 14A and 14B are a cross-sectional view and a top view, respectively, of a support structure of a semiconductor device according to an exemplary embodiment of the disclosure. FIGS. 14A and 14B correspond to the views in FIGS. 5D and 5E, respectively.

Referring to FIGS. 14A and 14B, a support structure SUSb of a semiconductor device may include an outer support layer OSUb extending through a gate stack structure GSTb, and a support pattern SUPb surrounded by the outer support layer OSUb.

A cavity CAb may be defined in the support structure SUSb. The cavity CAb may be defined by an inner side wall of the outer support layer OSUb and a bottom surface of the support pattern SUPb. A top surface SUPb_T of the support pattern SUPb and a top surface OSUb_T of the outer support layer OSUb may contact a bottom surface of an insulating layer 140b covering the support structure SUSb.

Figure 15A:
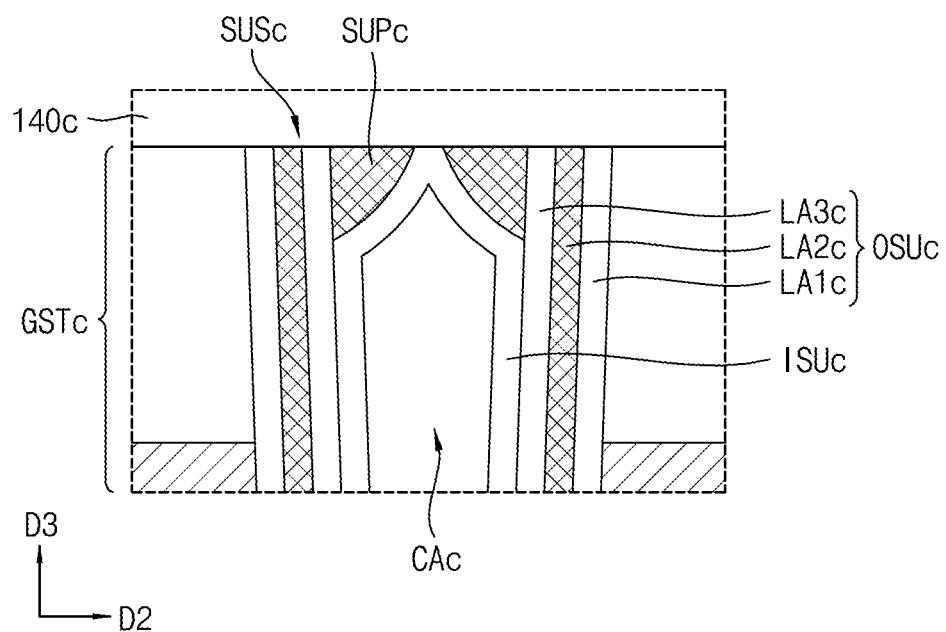
FIGS. 15A and 15B are views of a support structure of a semiconductor device according to an exemplary embodiment.
Figure 15B:
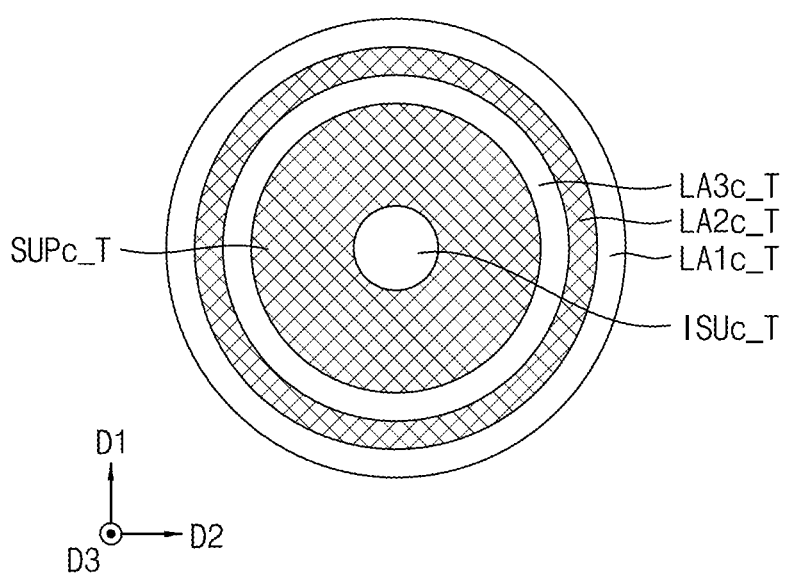

FIGS. 15A and 15B are a cross-sectional view and a top view, respectively, of a support structure of a semiconductor device according to an exemplary embodiment of the disclosure. FIGS. 15A and 15B correspond to the views in FIGS. 5D and 5E, respectively.

Referring to FIGS. 15A and 15B, a support structure SUSc of a semiconductor device may include an outer support layer OSUc extending through a gate stack structure GSTc, and a support pattern SUPc and an inner support layer ISUc which are surrounded by the outer support layer OSUc. The outer support layer OSUc may include a first layer LA1c, a second layer LA2c inside the first layer LA1c, and a third layer LA3c inside the second layer LA2c. The inner support layer ISUc may contact the support pattern SUPc and the third layer LA3c of the outer support layer OSUc.

A cavity CAc may be defined in the support structure SUSc. The cavity CAc may be defined by an inner surface of the inner support layer ISUc. A top surface SUPc_T of the support pattern SUPc, a top surface LA3c_T of the third layer LA3c, a top surface LA2c_T of the second layer LA2c, a top surface LA1c_T of the first layer LA1c, and a top surface ISUc_T of the inner support layer ISUc may contact a bottom surface of an insulating layer 140c covering the support structure SUSc.

Figure 16A:
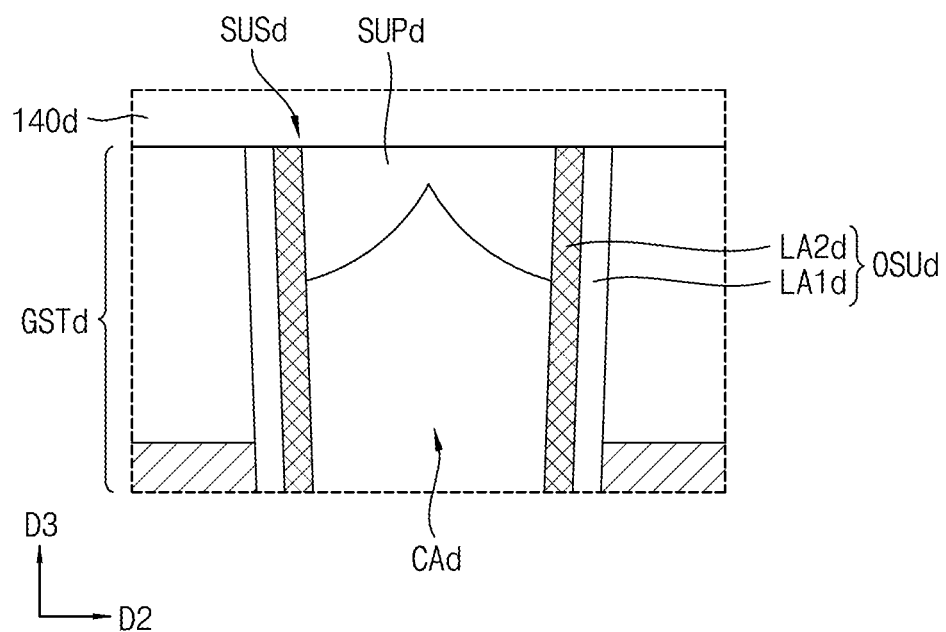
FIGS. 16A and 16B are views of a support structure of a semiconductor device according to an exemplary embodiment.
Figure 16B:
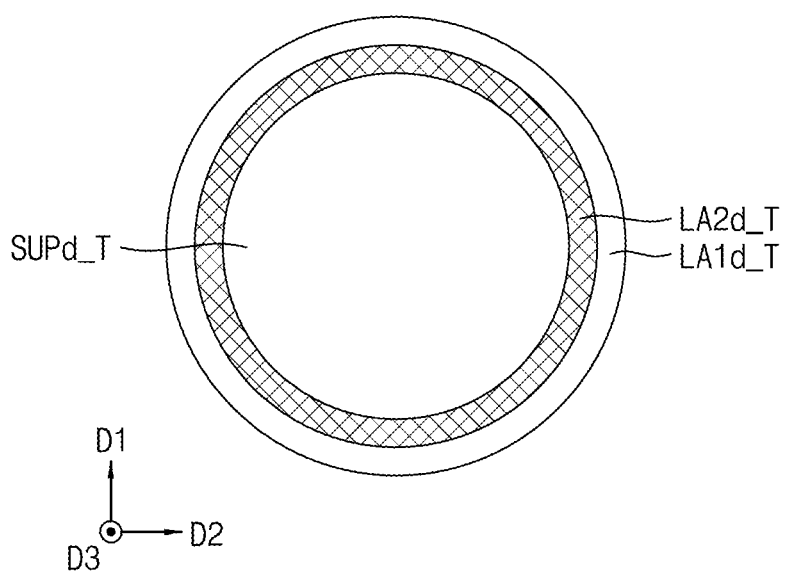

FIGS. 16A and 16B are a cross-sectional view and a top view, respectively, of a support structure of a semiconductor device according to an exemplary embodiment of the disclosure. FIGS. 16A and 16B correspond to the views in FIGS. 5D and 5E, respectively.

Referring to FIGS. 16A and 16B, a support structure SUSd of a semiconductor device may include an outer support layer OSUd extending through a gate stack structure GSTd, and a support pattern SUPd surrounded by the outer support layer OSUd. The outer support layer OSUd may include a first layer LA1d, and a second layer LA2d inside the first layer LA1d. The second layer LA2d may include the same material as a charge storage layer of a memory channel structure. The first layer LA1d may include the same material as a blocking layer of the memory channel structure.

A cavity CAd may be defined in the support structure SUSd. The cavity CAd may be defined by an inner side wall of the second layer LA2d and a bottom surface of the support pattern SUPd.

A top surface SUPd_T of the support pattern SUPd, a top surface LA2d_T of the second layer LA2d, and a top surface LA1d_T of the first layer LA1d may contact a bottom surface of an insulating layer 140d covering the support structure SUSd. An outer side wall of the support pattern SUPd may contact the inner side wall of the second layer LA2d.

The support pattern SUPd may include a material having etch selectivity with respect to a material included in the second layer LA2d. For example, when the second layer LA2d includes silicon nitride, the support pattern SUPd may include silicon oxide.

Figure 17A:
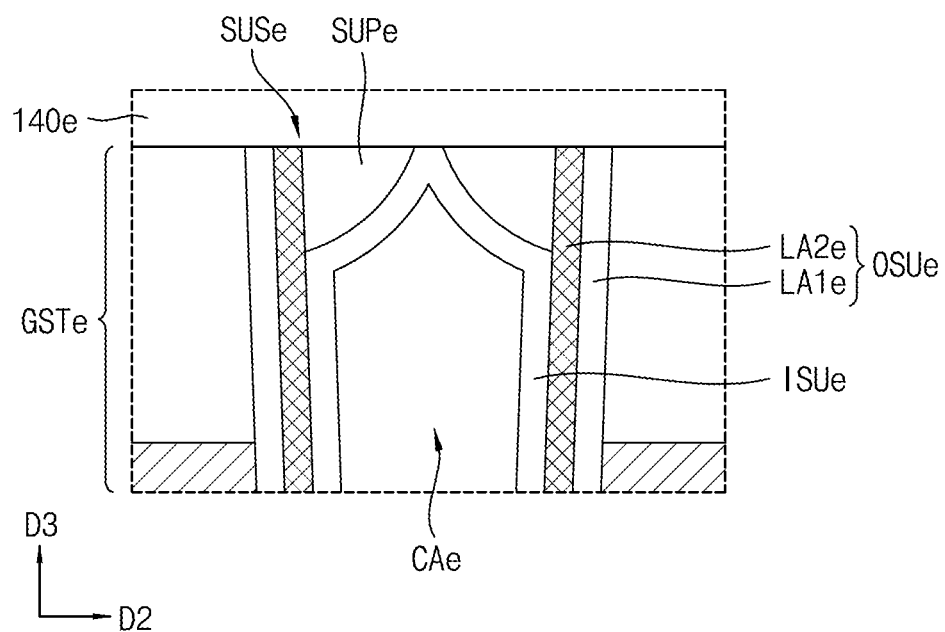
FIGS. 17A and 17B are views of a support structure of a semiconductor device according to an exemplary embodiment.
Figure 17B:
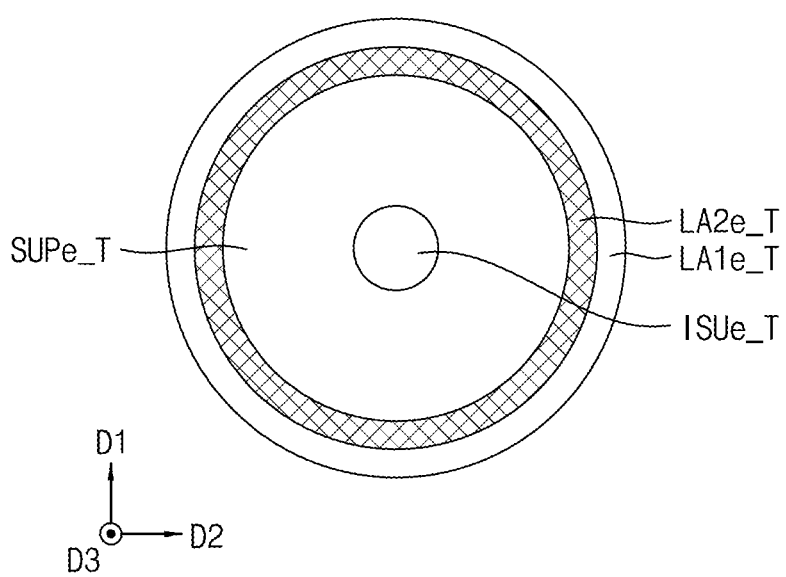

FIGS. 17A and 17B are a cross-sectional view and a top view, respectively, of a support structure of a semiconductor device according to an exemplary embodiment of the disclosure. FIGS. 17A and 17B correspond to the views in FIGS. 5D and 5E, respectively.

Referring to FIGS. 17A and 17B, a support structure SUSe of a semiconductor device may include an outer support layer OSUe extending through a gate stack structure GSTe, and a support pattern SUPe and an inner support layer ISUe surrounded by the outer support layer OSUe. The outer support layer OSUe may include a first layer LA1e, and a second layer LA2e inside the first layer LA1e. The inner support layer ISUe may contact the support pattern SUPe and the second layer LA2e of the outer support layer OSUe.

A cavity CAe may be defined in the support structure SUSe. The cavity CAe may be defined by an inner surface of the inner support layer ISUe. A top surface SUPe_T of the support pattern SUPe, a top surface LA2e_T of the second layer LA2e, a top surface LA1e_T of the first layer LA1e, and a top surface ISUe_T of the inner support layer ISUe may contact a bottom surface of an insulating layer 140e covering the support structure SUSe.

Figure 18A:
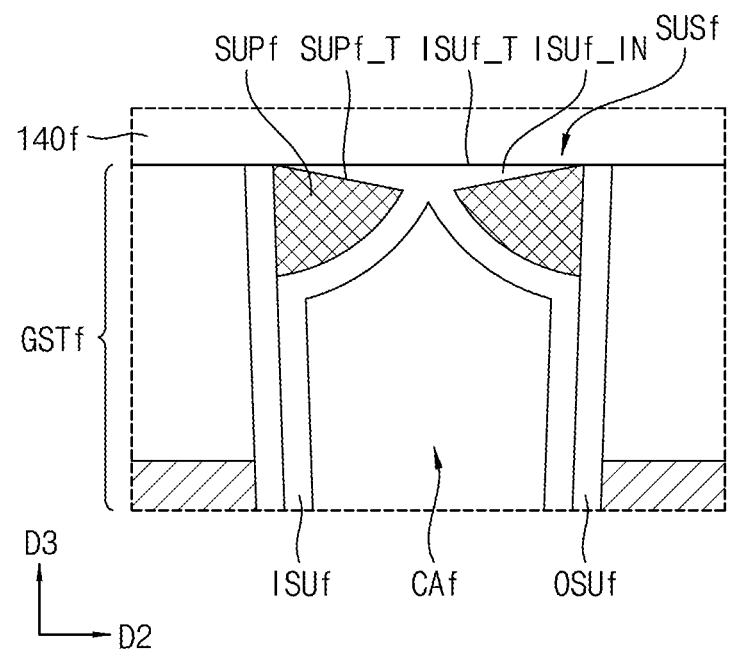
FIGS. 18A and 18B are views of a support structure of a semiconductor device according to an exemplary embodiment.
Figure 18B:
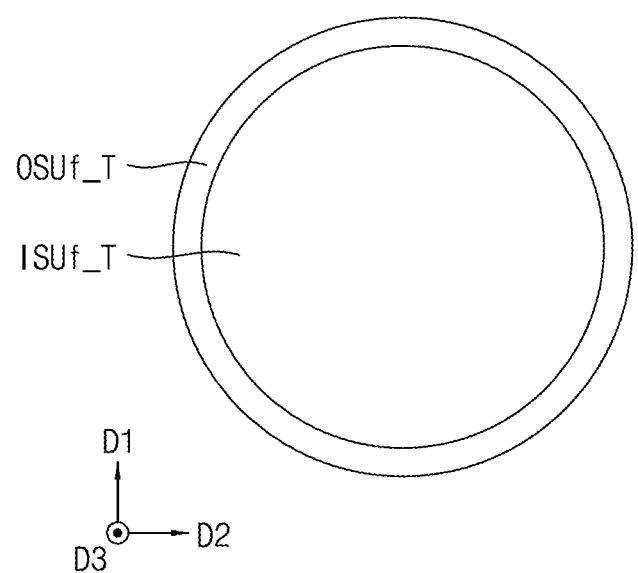

FIGS. 18A and 18B are a cross-sectional view and a top view, respectively, of a support structure of a semiconductor device according to an exemplary embodiment of the disclosure. FIGS. 18A and 18B correspond to the views in FIGS. 5D and 5E, respectively.

Referring to FIGS. 18A and 18B, a support structure SUSf of a semiconductor device may include an outer support layer OSUf extending through a gate stack structure GSTf, and a support pattern SUPf and an inner support layer ISUf surrounded by the outer support layer OSUf. A cavity CAf may be defined in the support structure SUSf. The cavity CAf may be defined by an inner surface of the inner support layer ISUf.

A top surface OSUf_T of the outer support layer OSUf and a top surface ISUf_T of the inner support layer ISUf may contact a bottom surface of an insulating layer 140*f* covering the support structure SUSf. A top surface SUPf_T of the support pattern SUPf may be spaced apart from the bottom surface of the insulating layer 140*f*. The top surface SUPf_T of the support pattern SUPf may have an inclination with respect to the bottom surface of the insulating layer 140*f*. In other words, the top surface SUPf_T of the support pattern SUPf may be inclined. The top surface SUPf_T of the support pattern SUPf may be flat. In exemplary embodiments, in a process for removing an upper portion of the support pattern SUPf, the upper portion of the support pattern SUPf may be removed by an etch-back process and, as such, the top surface SUPf_T of the support pattern SUPf may be inclined.

The inner support layer ISUf may include an intermediate section ISUf_IN interposed between the top surface SUPf_T of the support pattern SUPf and the bottom surface of the insulating layer 140*f*. The intermediate section ISUf_IN may contact the bottom surface of the insulating layer 140*f* and the top surface SUPf_T of the support pattern SUPf.

Figure 19:
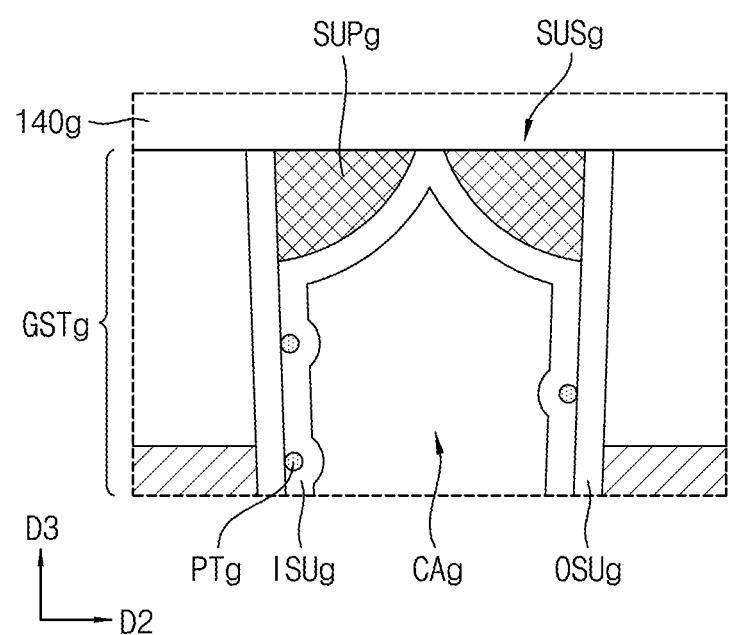
FIG. 19 is a view of a support structure of a semiconductor device according to an exemplary embodiment.

FIG. 19 is a cross-sectional view of a semiconductor device according to an exemplary embodiment of the disclosure. FIG. 19 corresponds to the view in FIG. 5D.

Referring to FIG. 19, a support structure SUSg of a semiconductor device may include an outer support layer OSUg extending through a gate stack structure GSTg, and a support pattern SUPg and an inner support layer ISUfg surrounded by the outer support layer OSUg. A cavity CAg may be defined in the support structure SUSg. The cavity CAg may be defined by an inner surface of the inner support layer ISUg.

Particles PTg contacting an inner side wall of the outer support layer OSUg may be provided. In exemplary embodiments, the particles PTg may be a process material used in a semiconductor device manufacturing process. For example, the particles PTg may be a material used in chemical mechanical polishing (CMP). The particles PTg may be covered by the inner support layer ISUg.

By way of summation and review, exemplary embodiments of the disclosure provide a semiconductor device having enhanced electrical characteristics. Exemplary embodiments of the disclosure provide an electronic system including a semiconductor device having enhanced electrical characteristics.

In a semiconductor device according to exemplary embodiments of the disclosure, particles used in a semiconductor device manufacturing process may be covered by an inner support layer and, as such, electrical failure caused by the particles may be prevented even when the particles penetrate into a support structure. That is, a semiconductor device according to the exemplary embodiments may include a support pattern at an upper portion of a dummy plug and, as such, a size of an air gap in the dummy plug may be maximized, thereby reducing costs, e.g., caused by forming a polysilicon dummy plug or by filling the dummy plug with an oxide, and enhancing electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a peripheral circuit structure including a peripheral transistor;
a semiconductor layer on the peripheral circuit structure;
a source structure on the semiconductor layer;
a gate stack structure on the source structure, the gate stack structure including insulating patterns and conductive patterns alternately stacked;
a memory channel structure penetrating the gate stack structure, the memory channel structure being electrically connected to the source structure;
a support structure penetrating the gate stack structure and the source structure, the support structure including:
an outer support layer in contact with side walls of the insulating patterns and side walls of the conductive patterns, and
a support pattern and an inner support layer in contact with an inner side wall of the outer support layer; and
an insulating layer covering the gate stack structure, the memory channel structure, and the support structure,
wherein a top surface of the outer support layer, a top surface of the inner support layer, and a top surface of the support pattern being in contact with a bottom surface of the insulating layer.

2. The semiconductor device as claimed in claim 1, wherein the top surface of the inner support layer is surrounded by the top surface of the support pattern.

3. The semiconductor device as claimed in claim 1, wherein:
the memory channel structure includes a blocking layer, a charge storage layer, and a tunnel insulating layer; and
the outer support layer includes a first layer having a same material as the blocking layer.

4. The semiconductor device as claimed in claim 3, wherein the outer support layer further includes a second layer having a same material as the charge storage layer.

5. The semiconductor device as claimed in claim 4, wherein the outer support layer further includes a third layer having a same material as the tunnel insulating layer.

6. The semiconductor device as claimed in claim 1, wherein:
the support pattern includes a first curved surface contacting the inner support layer; and
the inner support layer includes a second curved surface contacting the first curved surface of the support pattern.

7. The semiconductor device as claimed in claim 1, wherein the support pattern includes a material having an etch selectivity with respect to a material of the outer support layer.

8. A semiconductor device, comprising:
a gate stack structure including an insulating pattern and a conductive pattern alternately stacked;
a memory channel structure penetrating the gate stack structure in a cell region; and
a support structure penetrating the gate stack structure in an extension region, the support structure including:

an outer support layer contacting a side wall of the insulating pattern and a side wall of the conductive pattern, and an inner support layer and a support pattern both contacting an inner side wall of the outer support layer, an upper portion of the inner support layer being surrounded by the support pattern when viewed in plan view.

9. The semiconductor device as claimed in claim 8, wherein a top surface of the inner support layer and a top surface of the support pattern are coplanar.

10. The semiconductor device as claimed in claim 8, wherein the upper portion of the inner support layer is at a same level as the support pattern.

11. The semiconductor device as claimed in claim 8, wherein the support structure further includes a closed cavity defined by an inner surface of the inner support layer.

12. The semiconductor device as claimed in claim 11, wherein an upper portion of the cavity is at a same level as the support pattern.

13. The semiconductor device as claimed in claim 8, wherein:

the inner support layer is in contact with a lower portion of the inner side wall of the outer support layer; and the support pattern is in contact with an upper portion of the inner side wall of the outer support layer.

14. The semiconductor device as claimed in claim 8, wherein the upper portion of the inner support layer is spaced apart from the outer support layer by the support pattern.

15. The semiconductor device as claimed in claim 8, wherein the support pattern includes a material having an etch selectivity with respect to a material of the outer support layer.

16. The semiconductor device as claimed in claim 8, wherein:

the support pattern includes a curved surface in contact with the inner support layer; and a width inside the curved surface is gradually increased as a level of the curved surface is lowered.

17. An electronic system, comprising;

a main substrate;

a semiconductor device on the main substrate; and a controller electrically connected to the semiconductor device on the main substrate, wherein the semiconductor device includes:

a gate stack structure having an insulating pattern and a conductive pattern alternately stacked, a memory channel structure penetrating the gate stack structure in a cell region of the semiconductor device, and a support structure penetrating the gate stack structure in an extension region of the semiconductor device, the support structure including:

an outer support layer in contact with a side wall of the insulating pattern and a side wall of the conductive pattern, a support pattern in contact with an inner side wall of the outer support layer, and a cavity defined by the inner side wall of the outer support layer and a bottom surface of the support pattern, an upper portion of the cavity being surrounded by the support pattern.

18. The electronic system as claimed in claim 17, wherein the upper portion of the cavity is at a same level as the support pattern.

19. The electronic system as claimed in claim 17, wherein the bottom surface of the support pattern is curved.

20. The electronic system as claimed in claim 17, wherein a top surface of the support pattern is inclined.

* * * * *